(12) United States Patent
Kim et al.

(10) Patent No.: US 12,446,233 B2
(45) Date of Patent: Oct. 14, 2025

(54) VARIABLE RESISTANCE MEMORY DEVICE

(71) Applicant: SAMSUNG ELECTRONICS CO., LTD., Suwon-si (KR)

(72) Inventors: Song Yi Kim, Yongin-si (KR); Junghyun Cho, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 671 days.

(21) Appl. No.: 17/540,298

(22) Filed: Dec. 2, 2021

(65) Prior Publication Data
US 2022/0271091 A1     Aug. 25, 2022

(30) Foreign Application Priority Data

Feb. 23, 2021    (KR) ........................ 10-2021-0023837

(51) Int. Cl.
*H10B 63/00*     (2023.01)
(52) U.S. Cl.
CPC ................... *H10B 63/84* (2023.02)
(58) Field of Classification Search
CPC ...... H10N 70/20; H10N 70/231; H10B 63/24; H10B 63/30; H10B 63/20
See application file for complete search history.

(56) References Cited

U.S. PATENT DOCUMENTS

| | | | |
|---|---|---|---|
| 7,453,132 B1 | 11/2008 | Gunn, III et al. | |
| 7,683,404 B2 | 3/2010 | Jang et al. | |
| 7,977,725 B2 | 7/2011 | Yoon et al. | |
| 8,936,972 B2 | 1/2015 | Bangsaruntip et al. | |
| 9,450,381 B1 | 9/2016 | Cai et al. | |
| 9,742,147 B2 | 8/2017 | Cai et al. | |
| 10,283,452 B2 | 5/2019 | Zhu et al. | |
| 10,692,881 B2 * | 6/2020 | Hwang | H01L 21/76898 |
| 10,797,028 B2 | 10/2020 | Liu et al. | |
| 2005/0151228 A1 | 7/2005 | Tanida et al. | |

(Continued)

FOREIGN PATENT DOCUMENTS

| | | |
|---|---|---|
| JP | 2005-167093 A | 6/2005 |
| JP | 2010165982 A | 7/2010 |

(Continued)

OTHER PUBLICATIONS

Examination Report dated Jan. 21, 2025 from the Korean Patent Office for corresponding application No. 10-2021-0023837.

*Primary Examiner* — Mounir S Amer
(74) *Attorney, Agent, or Firm* — Muir Patent Law, PLLC

(57) ABSTRACT

A variable resistance memory device includes a memory cell structure on a substrate, the memory cell structure including conductive layers, each of the conductive layers including conductive lines spaced apart from each other in a direction parallel to a top surface of the substrate, and memory cell arrays alternatingly stacked with the conductive layers in a first direction perpendicular to a top surface of the substrate, a first peripheral circuit layer between the substrate and the memory cell structure, the first peripheral circuit layer including first transistors, and a second peripheral circuit layer between the first peripheral circuit layer and the memory cell structure, the second peripheral circuit layer including second transistors, and the second transistors including core transistors that are connected to corresponding ones of the conductive lines.

19 Claims, 10 Drawing Sheets

(56) References Cited

U.S. PATENT DOCUMENTS

| | | | |
|---|---|---|---|
| 2016/0141003 A1* | 5/2016 | Saitoh | H10B 63/34 |
| | | | 365/226 |
| 2019/0027482 A1* | 1/2019 | Kim | H10B 12/50 |
| 2020/0098776 A1 | 3/2020 | Sugisaki | |
| 2020/0105345 A1 | 4/2020 | Baek et al. | |
| 2020/0328186 A1* | 10/2020 | Liu | H01L 25/50 |
| 2020/0411541 A1* | 12/2020 | Oh | H10B 43/27 |
| 2022/0122932 A1* | 4/2022 | Oh | G11C 5/025 |
| 2022/0130846 A1* | 4/2022 | Kim | H10B 41/27 |

FOREIGN PATENT DOCUMENTS

| | | |
|---|---|---|
| JP | 2016-100387 A | 5/2016 |
| KR | 10-0962229 A | 6/2010 |
| KR | 10-2019-0010807 A | 1/2019 |

* cited by examiner

VARIABLE RESISTANCE MEMORY DEVICE

CROSS-REFERENCE TO RELATED APPLICATION

This U.S. non-provisional patent application claims priority under 35 U.S.C. § 119 to Korean Patent Application No. 10-2021-0023837, filed on Feb. 23, 2021, in the Korean Intellectual Property Office, the entire contents of which are hereby incorporated by reference.

BACKGROUND

1. Field

The present disclosure relates to a semiconductor device, and in particular, to a variable resistance memory device.

2. Description of the Related Art

Semiconductor memory devices are classified into volatile memory devices and nonvolatile memory devices. The volatile memory devices lose their stored data when their power supply is interrupted, and a dynamic random access memory (DRAM) device and a static random access memory (SRAM) device are typical examples of the volatile memory devices. By contrast, the nonvolatile memory devices retain their data even when their power supply is interrupted and a programmable read only memory (PROM) device, an erasable PROM (EPROM) device, an electrically EPROM (EEPROM) device, and a flash memory device are typical examples of the nonvolatile memory devices.

To meet the recent demand for semiconductor memory devices with high performance and low power consumption, next-generation semiconductor memory devices, such as a magnetic random access memory (MRAM) and a phase-change random access memory (PRAM), have been developed. Each of the next generation semiconductor memory devices includes a material whose resistance varies depending on a current or voltage applied thereto and is not changed even when a supplied current or voltage is interrupted.

SUMMARY

According to an embodiment, a variable resistance memory device may include a memory cell structure on a substrate, a first peripheral circuit layer disposed between the substrate and the memory cell structure, the first peripheral circuit layer including first transistors, and a second peripheral circuit layer disposed between the first peripheral circuit layer and the memory cell structure, the second peripheral circuit layer including second transistors. The memory cell structure may include conductive layers and memory cell arrays, which are alternatingly stacked in a first direction perpendicular to a top surface of the substrate. Each of the conductive layers may include a plurality of conductive lines, which are spaced apart from each other in a direction parallel to the top surface of the substrate. The second transistors may include core transistors that are connected to corresponding ones of the conductive lines.

According to an embodiment, a variable resistance memory device may include a first peripheral circuit layer, a second peripheral circuit layer, and a memory cell structure, which are stacked on a substrate in a first direction perpendicular to a top surface of the substrate. The first peripheral circuit layer may include first transistors on the substrate, and the second peripheral circuit layer may include a first semiconductor layer on the first peripheral circuit layer and second transistors on the first semiconductor layer. The memory cell structure may include conductive layers and memory cell arrays, which are alternately stacked on the second peripheral circuit layer in the first direction. Each of the conductive layers may include a plurality of conductive lines, which are spaced apart from each other in a direction parallel to the top surface of the substrate. Each of the memory cell arrays may include a plurality of memory cells, which are spaced apart from each other in a second direction and a third direction that are parallel to the top surface of the substrate and cross each other. Each of the memory cells may include a variable resistance pattern and a switching pattern, which are stacked in the first direction.

BRIEF DESCRIPTION OF THE DRAWINGS

Features will become apparent to those of skill in the art by describing in detail exemplary embodiments with reference to the attached drawings, in which.

It should be noted that these figures are intended to illustrate the general characteristics of methods, structure and/or materials utilized in certain example embodiments and to supplement the written description provided below. These drawings, however, may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity.

DETAILED DESCRIPTION

Figure 1:
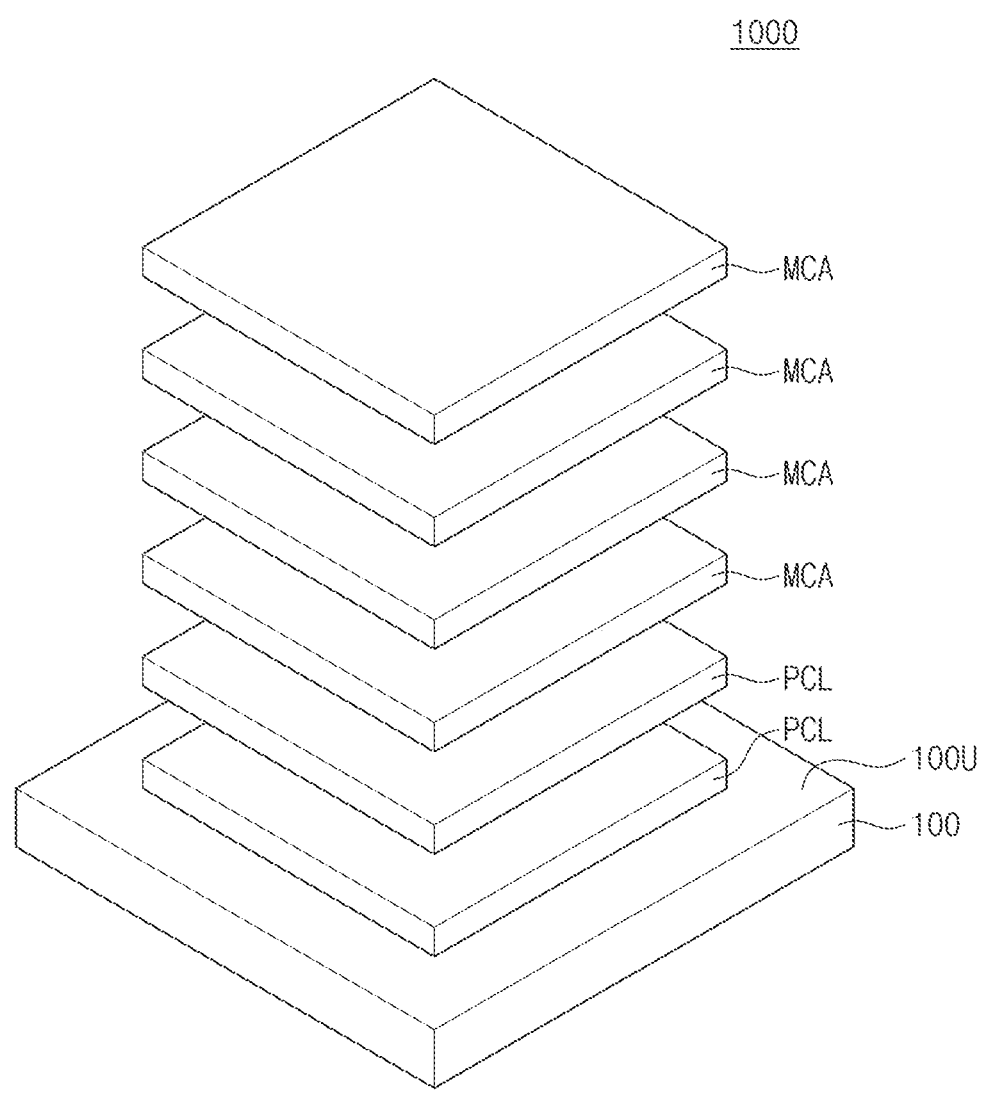
FIG. 1 is a conceptual diagram of a variable resistance memory device according to an embodiment.

FIG. 1 is a conceptual diagram of a variable resistance memory device according to an embodiment.

Referring to FIG. 1, a variable resistance memory device 1000 may include a plurality of peripheral circuit layers PCL and a plurality of memory cell arrays MCA, which are sequentially stacked on a substrate 100. The peripheral circuit layers PCL may be disposed between the lowermost one of the memory cell arrays MCA and the substrate 100. Each of the memory cell arrays MCA may include a plurality of memory cells, which are two-dimensionally arranged to be parallel to a top surface 100U of the substrate 100. The variable resistance memory device 1000 may further include a plurality of conductive layers, and the conductive layers and the memory cell arrays MCA may be alternatingly stacked on the uppermost one of the peripheral circuit layers PCL. Each of the memory cell arrays MCA may be interposed between a pair of the conductive layers adjacent thereto. Each of the conductive layers may include a plurality of conductive lines, which are used to perform write, read, and erase operations on the memory cells. FIG. 1 illustrates an example in which the variable resistance memory device 1000 includes two peripheral circuit layers PLC and four memory cell arrays MCA, but embodiments are not limited to this example.

Figure 2:
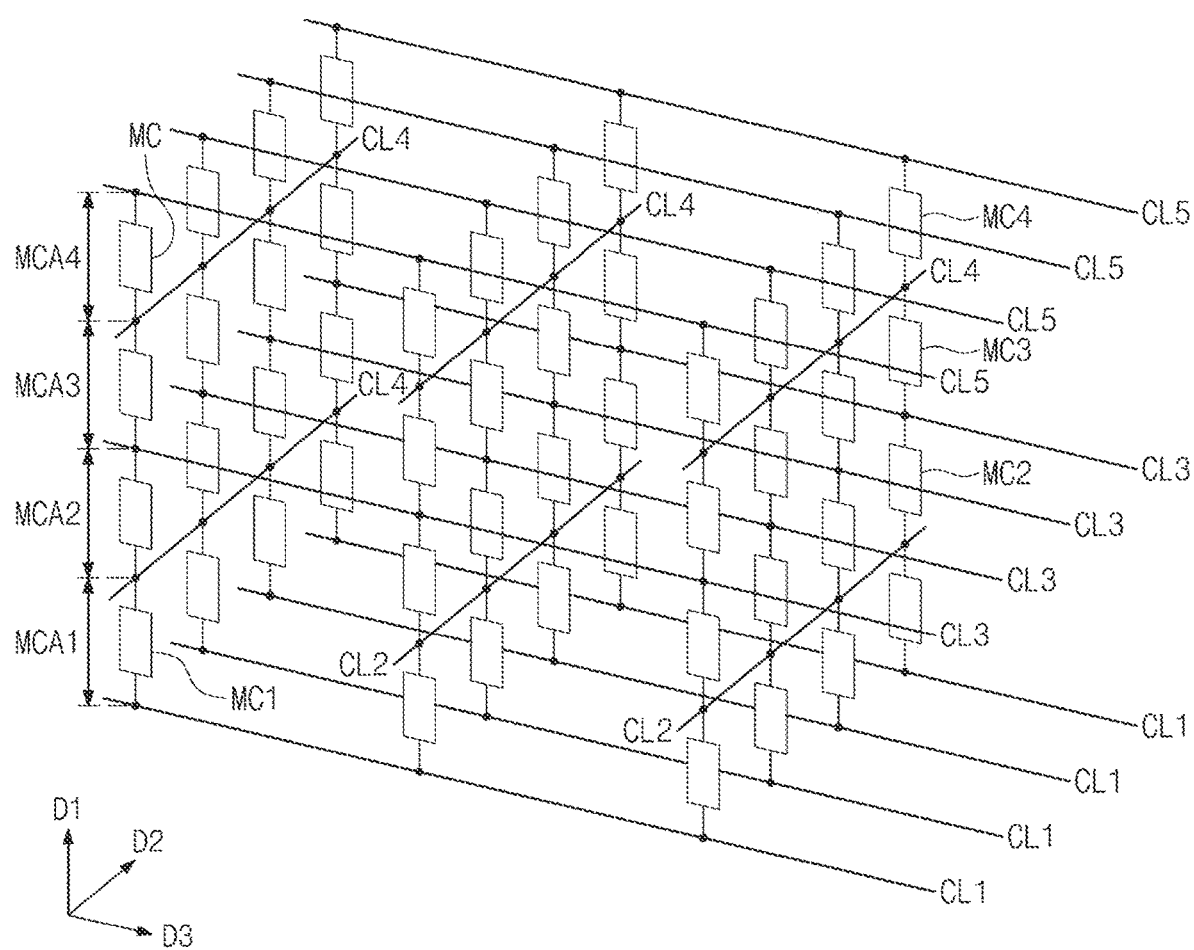
FIG. 2 is a circuit diagram of memory cell arrays of FIG. 1.

FIG. 2 is a circuit diagram illustrating the memory cell arrays MCA of FIG. 1. In FIG. 2, the memory cell arrays MCA of FIG. 1 may include a first memory cell array MCA1, a second memory cell array MCA2, a third memory cell array MCA3, and a fourth memory cell array MCA4.

Referring to FIG. 2, the first memory cell array MCA1 may be disposed between first conductive lines CL1 and second conductive lines CL2, and here, the second conductive lines CL2 may be provided to cross the first conductive lines CL1. The first memory cell array MCA1 may include first memory cells MC1, which are respectively disposed at intersections between the first conductive lines CL1 and the second conductive lines CL2. Each of the first memory cells MC1 may include a first variable resistance pattern and a first switching pattern, which are connected to each other in series between a corresponding pair of the first and second conductive lines CL1 and CL2.

The second memory cell array MCA2 may be disposed between the second conductive lines CL2 and third conductive lines CL3, and here, the third conductive lines CL3 may be provided to cross the second conductive lines CL2. The second memory cell array MCA2 may include second memory cells MC2, which are respectively disposed at intersections between the second conductive lines CL2 and the third conductive lines CL3. Each of the second memory cells MC2 may include a second variable resistance pattern and a second switching pattern, which are connected to each other in series between a corresponding pair of the second and third conductive lines CL2 and CL3. In some embodiments, the first memory cell array MCA1 and the second memory cell array MCA2 may share the second conductive lines CL2.

The third memory cell array MCA3 may be disposed between the third conductive lines CL3 and fourth conductive lines CL4, and here, the fourth conductive lines CL4 may be provided to cross the third conductive lines CL3. The third memory cell array MCA3 may include third memory cells MC3, which are respectively disposed at intersections between the third conductive lines CL3 and the fourth conductive lines CL4. Each of the third memory cells MC3 may include a third variable resistance pattern and a third switching pattern, which are connected to each other in series between a corresponding pair of the third and fourth conductive lines CL3 and CL4. In some embodiments, the second memory cell array MCA2 and the third memory cell array MCA3 may share the third conductive lines CL3.

The fourth memory cell array MCA4 may be disposed between the fourth conductive lines CL4 and fifth conductive lines CL5, and here, the fifth conductive lines CL5 may be provided to cross the fourth conductive lines CL4. The fourth memory cell array MCA4 may include fourth memory cells MC4, which are respectively disposed at intersections between the fourth conductive lines CL4 and the fifth conductive lines CL5. Each of the fourth memory cells MC4 may include a fourth variable resistance pattern and a fourth switching pattern, which are connected to each other in series between a corresponding pair of the fourth and fifth conductive lines CL4 and CL5. In some embodiments, the third memory cell array MCA3 and the fourth memory cell array MCA4 may share the fourth conductive lines CL4.

FIG. 2 illustrates an example in which the variable resistance memory device 1000 has the first to fourth memory cell arrays MCA1 to MCA4, but embodiments are not limited thereto. Additional memory cell arrays and additional conductive lines may be stacked on the fourth memory cell array MCA4. The additional memory cell arrays may be configured to have substantially the same features as the first to fourth memory cell arrays MCA1 to MCA4, and the additional conductive lines may be configured to have substantially the same features as the first to fifth conductive lines CL1 to CL5.

Figure 3:
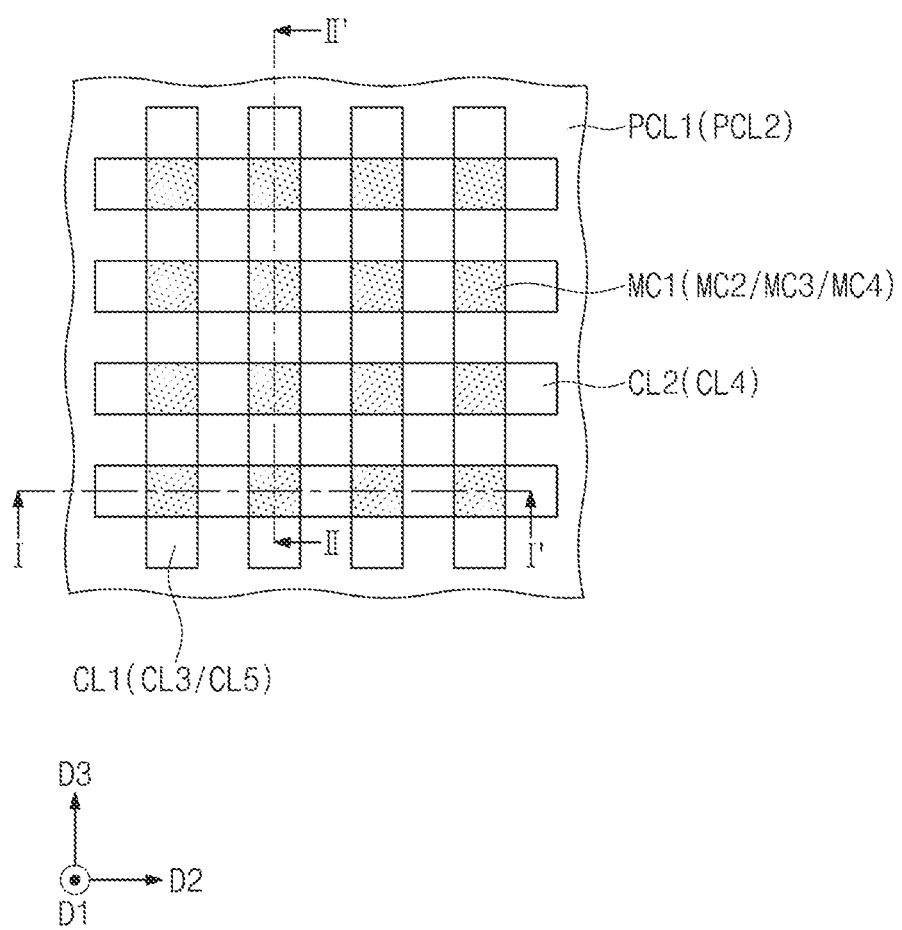
FIG. 3 is a plan view of a variable resistance memory device according to an embodiment.
Figure 4:
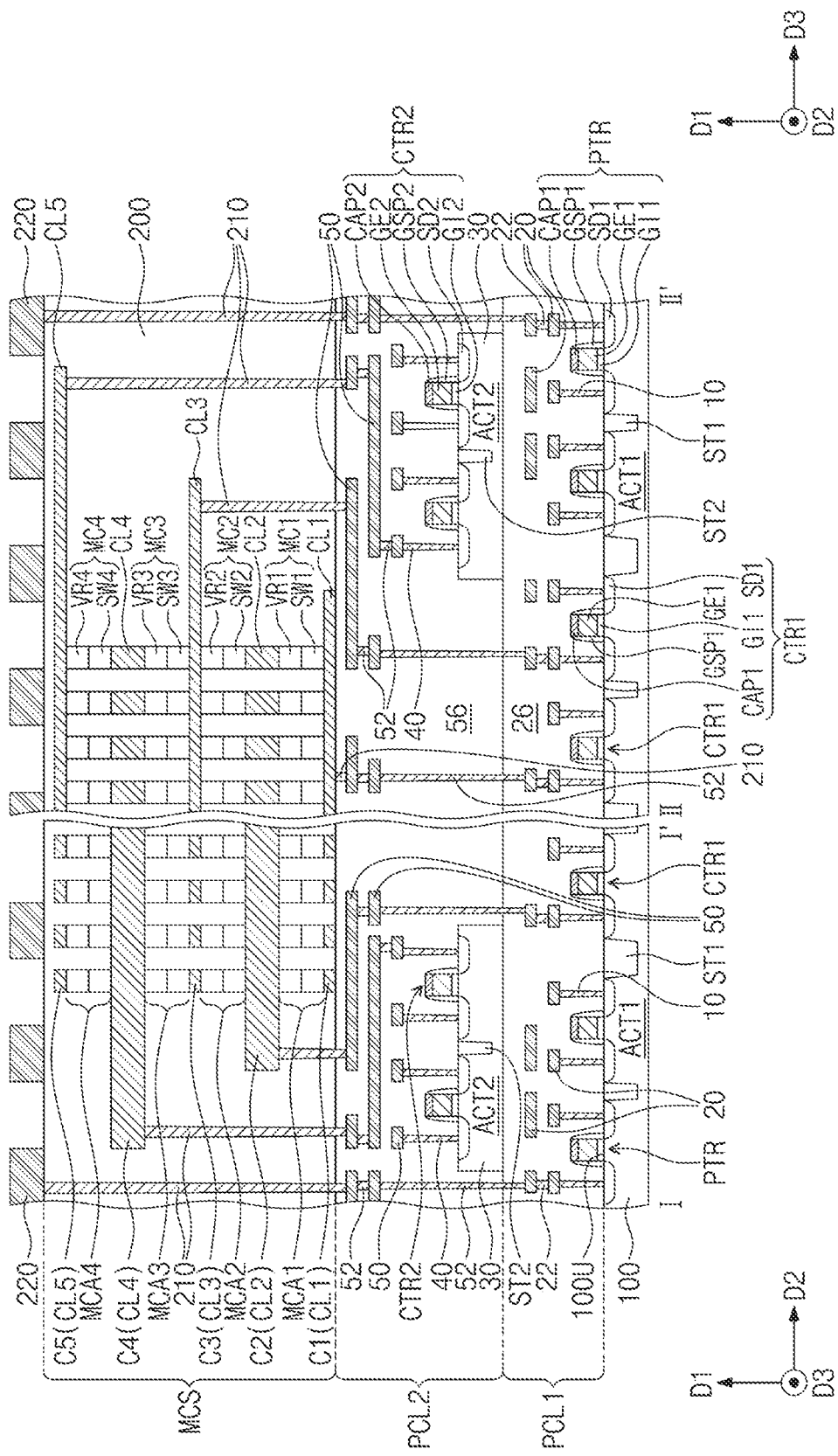
FIG. 4 is a cross-sectional view taken along lines I-I' and II-II' of FIG. 3.

FIG. 3 is a plan view of a variable resistance memory device according to an embodiment. FIG. 4 is a cross-sectional view along lines I-I' and II-II' of FIG. 3.

Referring to FIGS. 3 and 4, a first peripheral circuit layer PCL1 and a second peripheral circuit layer PCL2 may be sequentially stacked on the substrate 100. For example, the first and second peripheral circuit layers PCL1 and PCL2 in FIG. 4 refer to the peripheral circuit layers PCL in FIG. 1.

The substrate 100 may be a semiconductor substrate (e.g., a silicon wafer or a silicon-on-insulator (SOI) wafer). The first peripheral circuit layer PCL1 and the second peripheral circuit layer PCL2 may be stacked in a first direction D1 perpendicular to the top surface 100U of the substrate 100, and the first peripheral circuit layer PCL1 may be interposed between the substrate 100 and the second peripheral circuit layer PCL2.

The first peripheral circuit layer PCL1 may include first transistors PTR and CTR1 on the substrate 100. The first transistors PTR and CTR1 may constitute row and column decoders, a page buffer, and a control circuit. The first transistors PTR and CTR1 may include first core transistors CTR1, e.g., electrically connected to a bulk of a memory cell structure MCS (to be described later), and peripheral transistors PTR, e.g., electrically connected to a periphery of the memory cell structure MCS. In an embodiment, the first transistors PTR and CTR1 may be field effect transistors. A first device isolation pattern ST1 may be disposed in the substrate 100 to define a first active region ACT1. The first device isolation pattern ST1 may be formed of or include at least one of, e.g., silicon oxide, silicon nitride, and/or silicon oxynitride. Each of the first transistors PTR and CTR1 may include a first gate electrode GE1 on the first active region ACT1, a first gate insulating pattern GI1 between the first active region ACT1 and the first gate electrode GE1, a first gate capping pattern CAP1 on a top surface of the first gate electrode GE1, first gate spacers GSP1 on opposite side surfaces of the first gate electrode GE1, and first source/drain regions SD1 provided in the first active region ACT1 and at both sides of the first gate electrode GE1.

The first gate electrode GE1 may be formed of or include at least one of, e.g., doped semiconductor materials, conductive metal nitrides, and/or metallic materials. The first gate insulating pattern GI1 may be formed of or include at least one of, e.g., silicon oxide, silicon nitride, silicon oxynitride, or high-k dielectric materials. The high-k dielectric materials may include materials whose dielectric constants are higher than silicon oxide, e.g., hafnium oxide (HfO), aluminum oxide (AlO), or tantalum oxide (TaO). Each of the first gate spacers GSP1 and the first gate capping pattern CAP1 may be formed of or include at least one of, e.g., silicon oxide, silicon nitride, or silicon oxynitride.

The first peripheral circuit layer PCL1 may further include first interconnection patterns 20 and 22 disposed on the first transistors PTR and CTR1. The first interconnection patterns 20 and 22 may include first interconnection lines 20, which are vertically spaced apart from the substrate 100, and first interconnection contacts 22, which are provided between the first interconnection lines 20. The first interconnection lines 20 and the first interconnection contacts 22 may be formed of or include at least one conductive material, e.g., metallic materials. The first transistors PTR and CTR1 may be connected to corresponding ones of the first interconnection patterns 20 and 22. For example, the first source/drain regions SD1 of each of the first transistors PTR and CTR1 may be connected to corresponding ones of the first interconnection lines 20 and corresponding ones of the first interconnection contacts 22 through first source/drain contacts 10. The first gate electrode GE1 of each of the first transistors PTR and CTR1 may be connected to a corresponding one of the first interconnection lines 20 and a corresponding one of the first interconnection contacts 22 through a first gate contact. The first source/drain contacts 10 and the first gate contact may be formed of or include at least one conductive material.

The first peripheral circuit layer PCL1 may further include a first lower interlayer insulating layer 26, which is disposed on the substrate 100 to cover the first transistors PTR and CTR1, the first source/drain contacts 10, the first gate contact, and the first interconnection patterns 20 and 22. The first lower interlayer insulating layer 26 may cover the first transistors PTR and CTR1, and here, the first source/drain contacts 10, the first gate contact, and the first interconnection patterns 20 and 22 may be disposed in the first lower interlayer insulating layer 26. Each of the first transistors PTR and CTR1 may be connected to corresponding ones of the first interconnection patterns 20 and 22 through the first source/drain contacts 10 and the first gate contact. The first lower interlayer insulating layer 26 may be formed of or include, e.g., silicon oxide, silicon nitride, and/or silicon oxynitride.

The second peripheral circuit layer PCL2 may include a first semiconductor layer 30, and second transistors CTR2 on the first semiconductor layer 30. The first semiconductor layer 30 may be disposed on the first lower interlayer insulating layer 26 and may be formed of or include at least one of, e.g., single crystalline silicon and/or polycrystalline silicon. The second transistors CTR2 may constitute row and column decoders, a page buffer, and a control circuit. In some embodiments, the second transistors CTR2 may be second core transistors CTR2. In an embodiment, the second transistors CTR2 may be field effect transistors. A second device isolation pattern ST2 may be disposed in the first semiconductor layer 30 to define a second active region ACT2. The second device isolation pattern ST2 may be formed of or include, e.g., silicon oxide, silicon nitride, and/or silicon oxynitride. Each of the second transistors CTR2 may include a second gate electrode GE2 on the second active region ACT2, a second gate insulating pattern GI2 between the second active region ACT2 and the second gate electrode GE2, a second gate capping pattern CAP2 on a top surface of the second gate electrode GE2, second gate spacers GSP2 on opposite side surfaces of the second gate electrode GE2, and second source/drain regions SD2 provided in the second active region ACT2 and at both sides of the second gate electrode GE2.

The second gate electrode GE2, the second gate insulating pattern GI2, the second gate spacers GSP2, and the second gate capping pattern CAP2 may be provided to include substantially the same material as the first gate electrode GE1, the first gate insulating pattern GI1, the first gate spacers GSP1, and the first gate capping pattern CAP1, respectively.

The second peripheral circuit layer PCL2 may further include second interconnection patterns 50 and 52 disposed on the second transistors CTR2. The second interconnection patterns 50 and 52 may include second interconnection lines 50, which are vertically spaced apart from the first semiconductor layer 30, and second interconnection contacts 52, which are provided between the second interconnection lines 50. The second interconnection lines 50 and the second interconnection contacts 52 may be formed of or include at least one conductive material, e.g., metallic materials. The second transistors CTR2 may be connected to corresponding ones of the second interconnection patterns 50 and 52. For example, the second source/drain regions SD2 of each of the second transistors CTR2 may be connected to corresponding ones of the second interconnection lines 50 and corresponding ones of the second interconnection contacts 52 through second source/drain contacts 40. The second gate electrode GE2 of each of the second transistors CTR2 may be connected to a corresponding one of the second interconnection lines 50 and a corresponding one of the second interconnection contacts 52 through a second gate contact. The second source/drain contacts 40 and the second gate contact may be formed of or include at least one conductive material.

The second peripheral circuit layer PCL2 may further include a second lower interlayer insulating layer 56, which is disposed on the first semiconductor layer 30 to cover the second transistors CTR2, the second source/drain contacts 40, the second gate contact, and the second interconnection patterns 50 and 52. The second lower interlayer insulating layer 56 may cover the second transistors CTR2, and here, the second source/drain contacts 40, the second gate contact, and the second interconnection patterns 50 and 52 may be disposed in the second lower interlayer insulating layer 56. Each of the second transistors CTR2 may be connected to corresponding ones of the second interconnection patterns 50 and 52 through the second source/drain contacts 40 and the second gate contact. The second lower interlayer insulating layer 56 may include, e.g., silicon oxide, silicon nitride, and/or silicon oxynitride.

In some embodiments, a portion of the second lower interlayer insulating layer 56 may be provided to penetrate the first semiconductor layer 30 and to be in contact with the first lower interlayer insulating layer 26. Some of the second interconnection contacts 52 may be provided to penetrate the portion of the second lower interlayer insulating layer 56 and to be connected to corresponding ones of the first interconnection patterns 20 and 22. In an embodiment, such second interconnection contacts 52 may be connected to corresponding ones of the first interconnection lines 20.

A memory cell structure MCS may be disposed on the second peripheral circuit layer PCL2. The first peripheral circuit layer PCL1 may be disposed between the substrate 100 and the memory cell structure MCS, and the second peripheral circuit layer PCL2 may be disposed between the first peripheral circuit layer PCL1 and the memory cell structure MCS. The memory cell structure MCS may be disposed on the second lower interlayer insulating layer 56 of the second peripheral circuit layer PCL2. The memory cell structure MCS may include conductive layers, e.g., first through fifth conductive layers C1, C2, C3, C4, and C5, and memory cell arrays, e.g., the first through fourth memory cell arrays MCA1, MCA2, MCA3, and MCA4, which are alternatingly stacked in the first direction D1 perpendicular to the top surface 100U of the substrate 100. The lowermost conductive layer C1 of the conductive layers C1, C2, C3, C4, and C5 may be disposed on the second lower interlayer insulating layer 56, and the lowermost memory cell array MCA1 of the memory cell arrays MCA1, MCA2, MCA3, and MCA4 may be disposed on the lowermost conductive layer C1.

The conductive layers may include a first conductive layer C1, a second conductive layer C2, a third conductive layer C3, a fourth conductive layer C4, and a fifth conductive layer C5, which are vertically spaced apart from each other in the first direction D1. The first conductive layer C1 may be disposed on the second lower interlayer insulating layer 56 of the second peripheral circuit layer PCL2, and the second to fifth conductive layers C2, C3, C4, and C5 may be sequentially stacked on the first conductive layer C1 in the first direction D1. The memory cell arrays MCA1, MCA2, MCA3, and MCA4 may include a first memory cell array MCA1, a second memory cell array MCA2, a third memory cell array MCA3, and a fourth memory cell array MCA4, which are stacked in the first direction D1. The first memory cell array MCA1, the second memory cell array MCA2, the third memory cell array MCA3, and the fourth memory cell array MCA4 may be respectively disposed between the first conductive layer C1 and the second conductive layer C2, between the second conductive layer C2 and the third conductive layer C3, between the third conductive layer C3 and the fourth conductive layer C4, and between the fourth conductive layer C4 and the fifth conductive layer C5.

The first conductive layer C1 may include first conductive lines CL1, which are spaced apart from each other in a second direction D2 and are extended in a third direction D3. The second direction D2 and the third direction D3 may be parallel to the top surface 100U of the substrate 100 but may not be parallel to each other. The second conductive layer C2 may include second conductive lines CL2, which are extended in the second direction D2 and are spaced apart from each other in the third direction D3. The second conductive lines CL2 may be disposed to cross the first conductive lines CL1. The first memory cell array MCA1 may include first memory cells MC1, which are respectively disposed at intersections between the first conductive lines CL1 and the second conductive lines CL2. The first memory cells MC1 may be two-dimensionally arranged in the second direction D2 and the third direction D3 and may be spaced apart from each other. Each of the first memory cells MC1 may include a first variable resistance pattern VR1 and a first switching pattern SW1, which are connected to each other in series between a corresponding pair of the first and second conductive lines CL1 and CL2. The first variable resistance pattern VR1 and the first switching pattern SW1 may be stacked in the first direction D1. In some embodiments, the first switching pattern SW1 may be disposed below the first variable resistance pattern VR1, but embodiments are not limited thereto, e.g., the first variable resistance pattern VR1 may be disposed below the first switching pattern SW1.

Each of the first conductive lines CL1 may be connected to corresponding ones of the second interconnection patterns 50 and 52 of the second peripheral circuit layer PCL2 through a corresponding one of conductive contacts 210. Each of the first conductive lines CL1 may be connected to corresponding ones of the first interconnection patterns 20 and 22 of the first peripheral circuit layer PCL1 through the corresponding second interconnection patterns 50 and 52 and may be electrically connected to a terminal of a corresponding one of the first core transistors CTR1 of the first peripheral circuit layer PCL1 through the corresponding first interconnection patterns 20 and 22. Each of the second conductive lines CL2 may be connected to corresponding ones of the second interconnection patterns 50 and 52 of the second peripheral circuit layer PCL2 through a corresponding one of the conductive contacts 210. Each of the second conductive lines CL2 may connected to corresponding ones of the first interconnection patterns 20 and 22 of the first peripheral circuit layer PCL1 through the corresponding second interconnection patterns 50 and 52 and may be electrically connected to a terminal of a corresponding one of the first core transistors CTR1 of the first peripheral circuit layer PCL1 through the corresponding first interconnection patterns 20 and 22. In some embodiments, to perform the write, read, and erase operations on the first memory cells MC1, some of the first core transistors CTR1 of the first peripheral circuit layer PCL1 may be configured to control the first conductive lines CL1 and the second conductive lines CL2.

The third conductive layer C3 may include third conductive lines CL3, which are spaced apart from each other in the second direction D2 and are extended in the third direction D3. The third conductive lines CL3 may be disposed to cross the second conductive lines CL2. The second memory cell array MCA2 may include second memory cells MC2, which are respectively disposed at intersections between the second conductive lines CL2 and the third conductive lines CL3. The second memory cells MC2 may be two-dimensionally arranged in the second direction D2 and the third direction D3 and may be spaced apart from each other. Each of the second memory cells MC2 may include a second variable resistance pattern VR2 and a second switching pattern SW2, which are connected to each other in series between a corresponding pair of the second and third conductive lines CL2 and CL3. The second variable resistance pattern VR2 and the second switching pattern SW2 may be stacked in the first direction D1. In some embodiments, the second switching pattern SW2 may be below the second variable resistance pattern VR2, but embodiments are not limited thereto, e.g., the second variable resistance pattern VR2 may be below the second switching pattern SW2.

Each of the third conductive lines CL3 may be connected to corresponding ones of the second interconnection patterns 50 and 52 of the second peripheral circuit layer PCL2 through a corresponding one of the conductive contact 210. Each of the third conductive lines CL3 may be connected to corresponding ones of the first interconnection patterns 20 and 22 of the first peripheral circuit layer PCL1 through the corresponding second interconnection patterns 50 and 52 and may be electrically connected to a terminal of a corresponding one of the first core transistors CTR1 of the first peripheral circuit layer PCL1 through the corresponding first interconnection patterns 20 and 22. In some embodiments, to perform the write, read, and erase operations on the second memory cells MC2, some of the first core transistors CTR1 of the first peripheral circuit layer PCL1 may be configured to control the second conductive lines CL2 and the third conductive lines CL3.

The fourth conductive layer C4 may include fourth conductive lines CL4, which are extended in the second direction D2 and are spaced apart from each other in the third direction D3. The fourth conductive lines CL4 may be disposed to cross the third conductive lines CL3. The third memory cell array MCA3 may include third memory cells MC3, which are respectively disposed at intersections between the third conductive lines CL3 and the fourth conductive lines CL4. The third memory cells MC3 may be two-dimensionally arranged in the second direction D2 and the third direction D3, and may be spaced apart from each other. Each of the third memory cells MC3 may include a third variable resistance pattern VR3 and a third switching pattern SW3, which are connected to each other in series between a corresponding pair of the third and fourth conductive lines CL3 and CL4. The third variable resistance pattern VR3 and the third switching pattern SW3 may be stacked in the first direction D1. In some embodiments, the third switching pattern SW3 may be disposed below the third variable resistance pattern VR3, but embodiments are not limited thereto, e.g., the third variable resistance pattern VR3 may be disposed below the third switching pattern SW3.

Each of the fourth conductive lines CL4 may be connected to corresponding ones of the second interconnection patterns 50 and 52 of the second peripheral circuit layer PCL2 through a corresponding one of the conductive contacts 210. Each of the fourth conductive lines CL4 may be electrically connected to a terminal of a corresponding one of the second core transistors CTR2 of the second peripheral circuit layer PCL2 through the corresponding second interconnection patterns 50 and 52. In some embodiments, to perform the write, read, and erase operations on the third memory cells MC3, some of the first core transistors CTR1 of the first peripheral circuit layer PCL1 may be configured to control the third conductive lines CL3, and some of the second core transistors CTR2 of the second peripheral circuit layer PCL2 may be configured to control the fourth conductive lines CL4.

The fifth conductive layer C5 may include fifth conductive lines CL5, which are spaced apart from each other in the second direction D2 and are extended in the third direction D3. The fifth conductive lines CL5 may be disposed to cross the fourth conductive lines CL4. The fourth memory cell array MCA4 may include fourth memory cells MC4, which are respectively disposed at intersections between the fourth conductive lines CL4 and the fifth conductive lines CL5. The fourth memory cells MC4 may be two-dimensionally arranged in the second direction D2 and the third direction D3 and may be spaced apart from each other. Each of the fourth memory cells MC4 may include a fourth variable resistance pattern VR4 and a fourth switching pattern SW4, which are connected to each other in series between a corresponding pair of the fourth and fifth conductive lines CL4 and CL5. The fourth variable resistance pattern VR4 and the fourth switching pattern SW4 may be stacked in the first direction D1. In some embodiments, the fourth switching pattern SW4 may be disposed below the fourth variable resistance pattern VR4, but embodiments are not limited thereto, e.g., the fourth variable resistance pattern VR4 may be below the fourth switching pattern SW4.

Each of the fifth conductive lines CL5 may be connected to corresponding ones of the second interconnection patterns 50 and 52 of the second peripheral circuit layer PCL2 through a corresponding one of the conductive contacts 210. Each of the fifth conductive lines CL5 may be electrically connected to a terminal of a corresponding one of the second core transistors CTR2 of the second peripheral circuit layer PCL2 through the corresponding second interconnection patterns 50 and 52. In some embodiments, to perform the write, read, and erase operations on the fourth memory cells MC4, at least a portion of the second core transistors CTR2 of the second peripheral circuit layer PCL2 may be configured to control the fourth conductive lines CL4 and the fifth conductive lines CL5.

In some embodiments, to perform the write, read, and erase operations on the first to fourth memory cells MC1, MC2, MC3, and MC4, the first core transistors CTR1 of the first peripheral circuit layer PCL1 may be configured to control the first to third conductive lines CL1, CL2, and CL3, and the second core transistors CTR2 of the second peripheral circuit layer PCL2 may be configured to control the fourth and fifth conductive lines CL4 and CL5. The peripheral transistors PTR of the first peripheral circuit layer PCL1 may be connected to the first core transistors CTR1 and the second core transistors CTR2 through corresponding ones of the first interconnection patterns 20 and 22 and corresponding ones of the second interconnection patterns 50 and 52 and may constitute a peripheral circuit, which is used to operate the first to fourth memory cells MC1, MC2, MC3, and MC4.

The memory cell structure MCS may include an upper interlayer insulating layer 200 disposed on the second lower interlayer insulating layer 56 of the second peripheral circuit layer PCL2. The upper interlayer insulating layer 200 may cover the conductive layers C1, C2, C3, C4, and C5, the memory cell arrays MCA1, MCA2, MCA3, and MCA4, and the conductive contacts 210. In an embodiment, the upper interlayer insulating layer 200 may be formed of or include, e.g., silicon oxide, silicon nitride, and/or silicon oxynitride.

Upper interconnection lines 220 may be disposed on the upper interlayer insulating layer 200. Some of the upper interconnection lines 220 may be electrically connected to the peripheral transistors PTR of the first peripheral circuit layer PCL1 through corresponding ones of the conductive contacts 210, corresponding ones of the second interconnection patterns 50 and 52, and corresponding ones of the first interconnection patterns 20 and 22. The upper interconnection lines 220 may be formed of or include at least one metallic material.

To increase an integration density of a semiconductor device, a plurality of memory cell arrays may be vertically stacked on the substrate 100. As the number of the memory cell arrays stacked on the substrate 100 increases, it may be necessary to increase the number of conductive lines, which are used to perform the write, read, and erase operations on the memory cell arrays, and the number of transistors, which are used to control the conductive lines. However, due to a limitation on a given area on the substrate 100, it may be difficult to integrate the transistors on the substrate 100, and as a result, it may be difficult to increase an integration density of the semiconductor device.

According to an embodiment, the memory cell structure MCS may include a plurality of memory cell arrays MCA1, MCA2, MCA3, and MCA4 vertically stacked on the substrate 100, and a plurality of peripheral circuit layers PCL1 and PCL2 may be stacked between the substrate 100 and the memory cell structure MCS. The first peripheral circuit layer PLC1 may include the first core transistors CTR1, which are used to perform write, read, and erase operations on some of the memory cell arrays MCA1, MCA2, MCA3, and MCA4, and the second peripheral circuit layer PCL2 may include the second core transistors CTR2, which are used to perform the write, read, and erase operation on the remaining ones of the memory cell arrays MCA1, MCA2, MCA3, and MCA4. Since the peripheral circuit layers PCL1 and PCL2 are vertically stacked between the substrate 100 and the memory cell structure MCS, it may be possible to easily integrate the transistors, which are used to perform the operations on the memory cell arrays MCA1, MCA2, MCA3, and MCA4, on the substrate 100. Thus, it may be possible to easily realize a highly-integrated semiconductor device.

Figure 5:
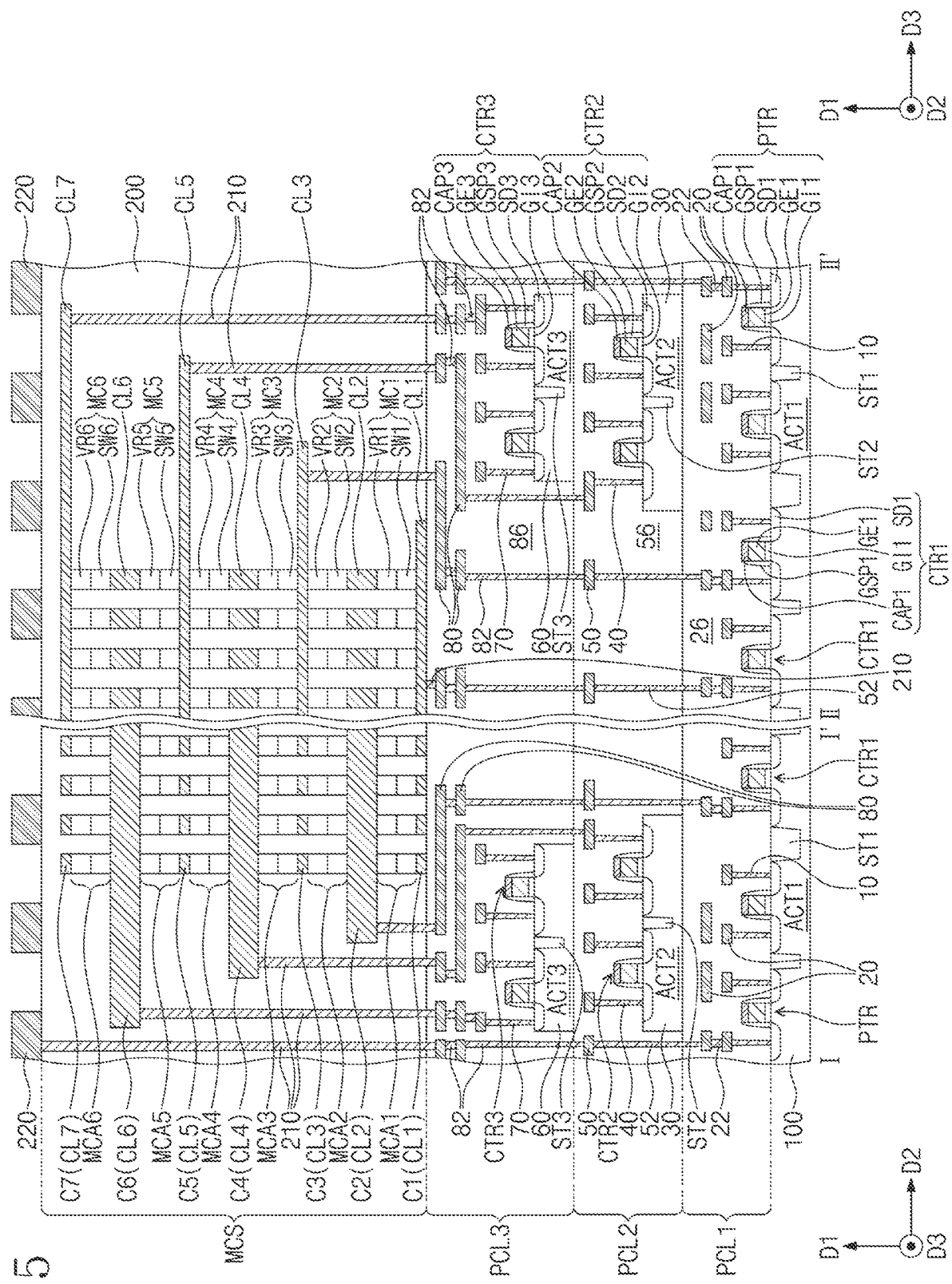
FIG. 5 is a cross-sectional view of a variable resistance memory device according to an embodiment and corresponding to lines I-I' and II-II' of FIG. 3.

FIG. 5 is a cross-sectional view of a variable resistance memory device according to an embodiment and corresponding to lines I-I' and of FIG. 3. For the sake of brevity, features, which are different from the variable resistance memory device described with reference to FIGS. 1 to 4, will be mainly described below.

Referring to FIGS. 3 and 5, a third peripheral circuit layer PCL3 may be disposed between the second peripheral circuit layer PCL2 and the memory cell structure MCS. The third peripheral circuit layer PCL3 may include a second semiconductor layer 60, and third transistors CTR3 on the second semiconductor layer 60.

The second semiconductor layer 60 may be disposed on the second lower interlayer insulating layer 56 and may be formed of or include at least one of, e.g., single crystalline silicon and/or polycrystalline silicon. The third transistors CTR3 may constitute row and column decoders, a page buffer, and a control circuit. In some embodiments, the third transistors CTR3 may be third core transistors CTR3. As an example, the third transistors CTR3 may be field effect transistors. A third device isolation pattern ST3 may be disposed in the second semiconductor layer 60 to define a third active region ACT3. The third device isolation pattern ST3 may be formed of or include at least one of, e.g., silicon oxide, silicon nitride, and/or silicon oxynitride. Each of the third transistors CTR3 may include a third gate electrode GE3 on the third active region ACT3, a third gate insulating pattern GI3 between the third active region ACT3 and the third gate electrode GE3, a third gate capping pattern CAP3 on a top surface of the third gate electrode GE3, third gate spacers GSP3 on opposite side surfaces of the third gate electrode GE3, and third source/drain regions SD3 provided in the third active region ACT3 and at both sides of the third gate electrode GE3.

The third gate electrode GE3, the third gate insulating pattern GI3, the third gate spacers GSP3, and the third gate capping pattern CAP3 may be provided to include substantially the same material as the first gate electrode GE1, the first gate insulating pattern GI1, the first gate spacers GSP1, and the first gate capping pattern CAP1, respectively.

The third peripheral circuit layer PCL3 may further include third interconnection patterns 80 and 82 disposed on the third transistors CTR3. The third interconnection patterns 80 and 82 may include third interconnection lines 80, which are vertically spaced apart from the second semiconductor layer 60, and third interconnection contacts 82, which are provided between the third interconnection lines 80. The third interconnection lines 80 and the third interconnection contacts 82 may be formed of or include at least one conductive material, e.g., metallic materials). The third transistors CTR3 may be connected to corresponding ones of the third interconnection patterns 80 and 82. For example, the third source/drain regions SD3 of each of the third transistors CTR3 may be connected to corresponding ones of the third interconnection lines 80 and corresponding ones of the third interconnection contacts 82 through third source/drain contacts 70. The third gate electrode GE3 of each of the third transistors CTR3 may be connected to a corresponding one of the third interconnection lines 80 and a corresponding one of the third interconnection contacts 82 through a third gate contact. The third source/drain contacts 70 and the third gate contact may be formed of or include at least one conductive material.

The third peripheral circuit layer PCL3 may further include a third lower interlayer insulating layer 86, which is disposed on the second semiconductor layer 60 to cover the third transistors CTR3, the third source/drain contacts 70, the third gate contact, and the third interconnection patterns 80 and 82. The third lower interlayer insulating layer 86 may cover the third transistors CTR3, and here, the third source/drain contacts 70, the third gate contact, and the third interconnection patterns 80 and 82 may be disposed in the third lower interlayer insulating layer 86. Each of the third transistors CTR3 may be connected to corresponding ones of the third interconnection patterns 80 and 82 through the third source/drain contacts 70 and the third gate contact. The third lower interlayer insulating layer 86 may be formed of or include, e.g., silicon oxide, silicon nitride, and/or silicon oxynitride.

In some embodiments, a portion of the third lower interlayer insulating layer 86 may be provided to penetrate the second semiconductor layer 60 and to be in contact with the second lower interlayer insulating layer 56. Some of the third interconnection contacts 82 may be provided to penetrate the portion of the third lower interlayer insulating layer 86 and to be connected to corresponding ones of the second interconnection patterns 50 and 52. In an embodiment, such third interconnection contacts 82 may be connected to corresponding ones of the second interconnection lines 50.

The memory cell structure MCS may be disposed on the third peripheral circuit layer PCL3. The first peripheral circuit layer PCL1 may be disposed between the substrate 100 and the memory cell structure MCS, and the second peripheral circuit layer PCL2 may be disposed between the first peripheral circuit layer PCL1 and the memory cell structure MCS. The third peripheral circuit layer PCL3 may be disposed between the second peripheral circuit layer PCL2 and the memory cell structure MCS. The memory cell structure MCS may be disposed on the third lower interlayer insulating layer 86 of the third peripheral circuit layer PCL3. The memory cell structure MCS may include conductive layers C1, C2, C3, C4, C5, C6, and C7 and memory cell arrays MCA1, MCA2, MCA3, MCA4, MCA5, and MCA6, which are alternatingly stacked in the first direction D1.

The conductive layers C1, C2, C3, C4, C5, C6, and C7 may include a first conductive layer C1, a second conductive layer C2, a third conductive layer C3, a fourth conductive layer C4, a fifth conductive layer C5, a sixth conductive layer C6, and a seventh conductive layer C7, which are vertically spaced apart from each other in the first direction D1. The first to fifth conductive layers C1, C2, C3, C4, and C5 may be configured to have substantially the same features as the first to fifth conductive layers C1, C2, C3, C4, and C5 described with reference to FIGS. 3 and 4. The first conductive layer C1 may be disposed on the third lower interlayer insulating layer 86 of the third peripheral circuit layer PCL3, and the second to seventh conductive layers C2, C3, C4, C5, C6, and C7 may be sequentially stacked on the first conductive layer C1 in the first direction D1. The memory cell arrays MCA1, MCA2, MCA3, MCA4, MCA5, and MCA6 may include a first memory cell array MCA1, a second memory cell array MCA2, a third memory cell array MCA3, a fourth memory cell array MCA4, a fifth memory cell array MCA5, and a sixth memory cell array MCA6, which are stacked in the first direction D1. The first to fourth memory cell arrays MCA1, MCA2, MCA3, and MCA4 may be configured to have substantially the same features as the first to fourth memory cell arrays MCA1, MCA2, MCA3, and MCA4 described with reference to FIGS. 3 and 4. The first memory cell array MCA1, the second memory cell array MCA2, the third memory cell array MCA3, the fourth memory cell array MCA4, the fifth memory cell array MCA5, and the sixth memory cell array MCA6 may be respectively disposed between the first conductive layer C1 and the second conductive layer C2, between the second conductive layer C2 and the third conductive layer C3, between the third conductive layer C3 and the fourth conductive layer C4, between the fourth conductive layer C4 and the fifth conductive layer C5, between the fifth conductive layer C5 and the sixth conductive layer C6, and between the sixth conductive layer C6 and the seventh conductive layer C7.

Each of the first conductive lines CL1 of the first conductive layer C1 may be connected to corresponding ones of the third interconnection patterns 80 and 82 of the third peripheral circuit layer PCL3 through a corresponding one of the conductive contacts 210. Each of the first conductive lines CL1 may be connected to corresponding ones of the second interconnection patterns 50 and 52 of the second peripheral circuit layer PCL2 through the corresponding third interconnection patterns 80 and 82, may be connected to corresponding ones of the first interconnection patterns 20 and 22 of the first peripheral circuit layer PCL1 through the corresponding second interconnection patterns 50 and 52, and may be electrically connected to a terminal of a corresponding one of the first core transistors CTR1 of the first peripheral circuit layer PCL1 through the corresponding first interconnection patterns 20 and 22.

Each of the second conductive lines CL2 of the second conductive layer C2 may be connected to corresponding ones of the third interconnection patterns 80 and 82 of the third peripheral circuit layer PCL3 through a corresponding one of the conductive contacts 210. Each of the second conductive lines CL2 may be connected to corresponding ones of the second interconnection patterns 50 and 52 of the second peripheral circuit layer PCL2 through the corresponding third interconnection patterns 80 and 82, may be connected to corresponding ones of the first interconnection patterns 20 and 22 of the first peripheral circuit layer PCL1 through the corresponding second interconnection patterns 50 and 52, and may be electrically connected to a terminal of a corresponding one of the first core transistors CTR1 of the first peripheral circuit layer PCL1 through the corresponding first interconnection patterns 20 and 22.

Each of the third conductive lines CL3 of the third conductive layer C3 may be connected to corresponding ones of the third interconnection patterns 80 and 82 of the third peripheral circuit layer PCL3 through a corresponding one of the conductive contacts 210. Each of the third conductive lines CL3 may be connected to corresponding ones of the second interconnection patterns 50 and 52 of the second peripheral circuit layer PCL2 through the corresponding third interconnection patterns 80 and 82, may be connected to corresponding ones of the first interconnection patterns 20 and 22 of the first peripheral circuit layer PCL1 through the corresponding second interconnection patterns 50 and 52, and may be electrically connected to a terminal of a corresponding one of the first core transistors CTR1 of the first peripheral circuit layer PCL1 through the corresponding first interconnection patterns 20 and 22.

In some embodiments, to perform the write, read, and erase operations on the first memory cells MC1 of the first memory cell array MCA1 and the second memory cells MC2 of the second memory cell array MCA2, the first core transistors CTR1 of the first peripheral circuit layer PCL1 may be configured to control the first to third conductive lines CL1, CL2, and CL3.

Each of the fourth conductive lines CL4 of the fourth conductive layer C4 may be connected to corresponding ones of the third interconnection patterns 80 and 82 of the third peripheral circuit layer PCL3 through a corresponding one of the conductive contacts 210. Each of the fourth conductive lines CL4 may be connected to corresponding ones of the second interconnection patterns 50 and 52 of the second peripheral circuit layer PCL2 through the corresponding third interconnection patterns 80 and 82 and may be electrically connected to a terminal of a corresponding one of the second core transistors CTR2 of the second peripheral circuit layer PCL2 through the corresponding second interconnection patterns 50 and 52.

Each of the fifth conductive lines CL5 of the fifth conductive layer C5 may be connected to corresponding ones of the third interconnection patterns 80 and 82 of the third peripheral circuit layer PCL3 through a corresponding one of the conductive contacts 210. Each of the fifth conductive lines CL5 may be connected to corresponding ones of the second interconnection patterns 50 and 52 of the second peripheral circuit layer PCL2 through the corresponding third interconnection patterns 80 and 82 and may be electrically connected to a terminal of a corresponding one of the second core transistors CTR2 of the second peripheral circuit layer PCL2 through the corresponding second interconnection patterns 50 and 52.

In some embodiments, to perform the write, read, and erase operations on the third memory cells MC3 of the third memory cell array MCA3 and the fourth memory cells MC4 of the fourth memory cell array MCA4, the second core transistors CTR2 of the second peripheral circuit layer PCL2 may be configured to control the fourth and fifth conductive lines CL4 and CL5.

The sixth conductive layer C6 may include sixth conductive lines CL6, which are extended in the second direction D2 and are spaced apart from each other in the third direction D3. The sixth conductive lines CL6 may be disposed to cross the fifth conductive lines CL5. The fifth memory cell array MCA5 may include fifth memory cells MC5, which are respectively disposed at intersections between the fifth conductive lines CL5 and the sixth conductive lines CL6. The fifth memory cells MC5 may be two-dimensionally arranged in the second direction D2 and the third direction D3 and may be spaced apart from each other. Each of the fifth memory cells MC5 may include a fifth variable resistance pattern VR5 and a fifth switching pattern SW5, which are connected to each other in series between a corresponding pair of the fifth and sixth conductive lines CL5 and CL6. The fifth variable resistance pattern VR5 and the fifth switching pattern SW5 may be stacked in the first direction D1. In some embodiments, the fifth switching pattern SW5 may be below the fifth variable resistance pattern VR5, but embodiments are not limited thereto, e.g., the fifth variable resistance pattern VR5 may be below the fifth switching pattern SW5.

Each of the sixth conductive lines CL6 may be connected to corresponding ones of the third interconnection patterns 80 and 82 of the third peripheral circuit layer PCL3 through a corresponding one of the conductive contacts 210. Each of the sixth conductive lines CL6 may be electrically connected to a terminal of a corresponding one of the third core transistors CTR3 of the third peripheral circuit layer PCL3 through the corresponding third interconnection patterns 80 and 82. In some embodiments, to perform the write, read, and erase operations on the fifth memory cells MC5, some of the second core transistors CTR2 of the second peripheral circuit layer PCL2 may be configured to control the fifth conductive lines CL5, and some of the third core transistors CTR3 of the third peripheral circuit layer PCL3 may be configured to control the sixth conductive lines CL6.

The seventh conductive layer C7 may include seventh conductive lines CL7, which are spaced apart from each other in the second direction D2 and are extended in the third direction D3. The seventh conductive lines CL7 may be disposed to cross the sixth conductive lines CL6. The sixth memory cell array MCA6 may include sixth memory cells MC6, which are respectively disposed at intersections between the sixth conductive lines CL6 and the seventh conductive lines CL7. The sixth memory cells MC6 may be two-dimensionally arranged in the second direction D2 and the third direction D3 and may be spaced apart from each other. Each of the sixth memory cells MC6 may include a sixth variable resistance pattern VR6 and a sixth switching pattern SW6, which are connected to each other in series between a corresponding pair of the sixth and seventh conductive lines CL6 and CL7. The sixth variable resistance pattern VR6 and the sixth switching pattern SW6 may be stacked in the first direction D1. In some embodiments, the sixth switching pattern SW6 may be disposed below the sixth variable resistance pattern VR6, but embodiments are not limited thereto, e.g., the sixth variable resistance pattern VR6 may be disposed below the sixth switching pattern SW6.

Each of the seventh conductive lines CL7 may be connected to corresponding ones of the third interconnection patterns 80 and 82 of the third peripheral circuit layer PCL3 through a corresponding one of the conductive contacts 210. Each of the seventh conductive lines CL7 may be electrically connected to a terminal of a corresponding one of the third core transistors CTR3 of the third peripheral circuit layer PCL3 through the corresponding third interconnection patterns 80 and 82. In some embodiments, to perform the write, read, and erase operations on the sixth memory cells MC6, the third core transistors CTR3 of the third peripheral circuit layer PCL3 may be configured to control the sixth conductive lines CL6 and the seventh conductive lines CL7.

In some embodiments, to perform the write, read, and erase operations on the fifth and sixth memory cells MC5 and MC6, the third core transistors CTR3 of the third peripheral circuit layer PCL3 may be configured to control the sixth and seventh conductive lines CL6 and CL7. The peripheral transistors PTR of the first peripheral circuit layer PCL1 may be connected to the first core transistors CTR1, the second core transistors CTR2, and the third core transistors CTR3 through corresponding ones of the first interconnection patterns 20 and 22, corresponding ones of the second interconnection patterns 50 and 52, and corresponding ones of the third interconnection patterns 80 and 82 and may constitute a peripheral circuit, which is used to operate the first to sixth memory cells MC1, MC2, MC3, MC4, MC5, and MC6.

The upper interlayer insulating layer 200 of the memory cell structure MCS may be disposed on the third lower interlayer insulating layer 86 of the third peripheral circuit layer PCL3 to cover the conductive layers C1, C2, C3, C4, C5, C6, and C7, the memory cell arrays MCA1, MCA2, MCA3, MCA4, MCA5, and MCA6, and the conductive contacts 210. The upper interconnection lines 220 may be disposed on the upper interlayer insulating layer 200. Some of the upper interconnection lines 220 may be electrically connected to the peripheral transistors PTR of the first peripheral circuit layer PCL1 through corresponding ones of the conductive contact 210, corresponding ones of the third interconnection patterns 80 and 82, corresponding ones of the second interconnection patterns 50 and 52, and corresponding ones of the first interconnection patterns 20 and 22.

In the present embodiments, the first peripheral circuit layer PLC1 may include the first core transistors CTR1, which are used to perform the write, read, and erase operations on some of the memory cell arrays MCA1, MCA2, MCA3, MCA4, MCA5, and MCA6, and the second peripheral circuit layer PCL2 may include the second core transistors CTR2, which are used to perform the write, read, and erase operations on others of the memory cell arrays MCA1, MCA2, MCA3, MCA4, MCA5, and MCA6. In addition, the third peripheral circuit layer PCL3 may include the third core transistors CTR3, which are used to perform the write, read, and erase operations on the remaining ones of the memory cell arrays MCA1, MCA2, MCA3, MCA4, MCA5, and MCA6. Accordingly, it may be possible to easily integrate transistors, which are used to operate the memory cell arrays MCA1, MCA2, MCA3, MCA4, MCA5, and MCA6, on the substrate 100.

Figure 6:
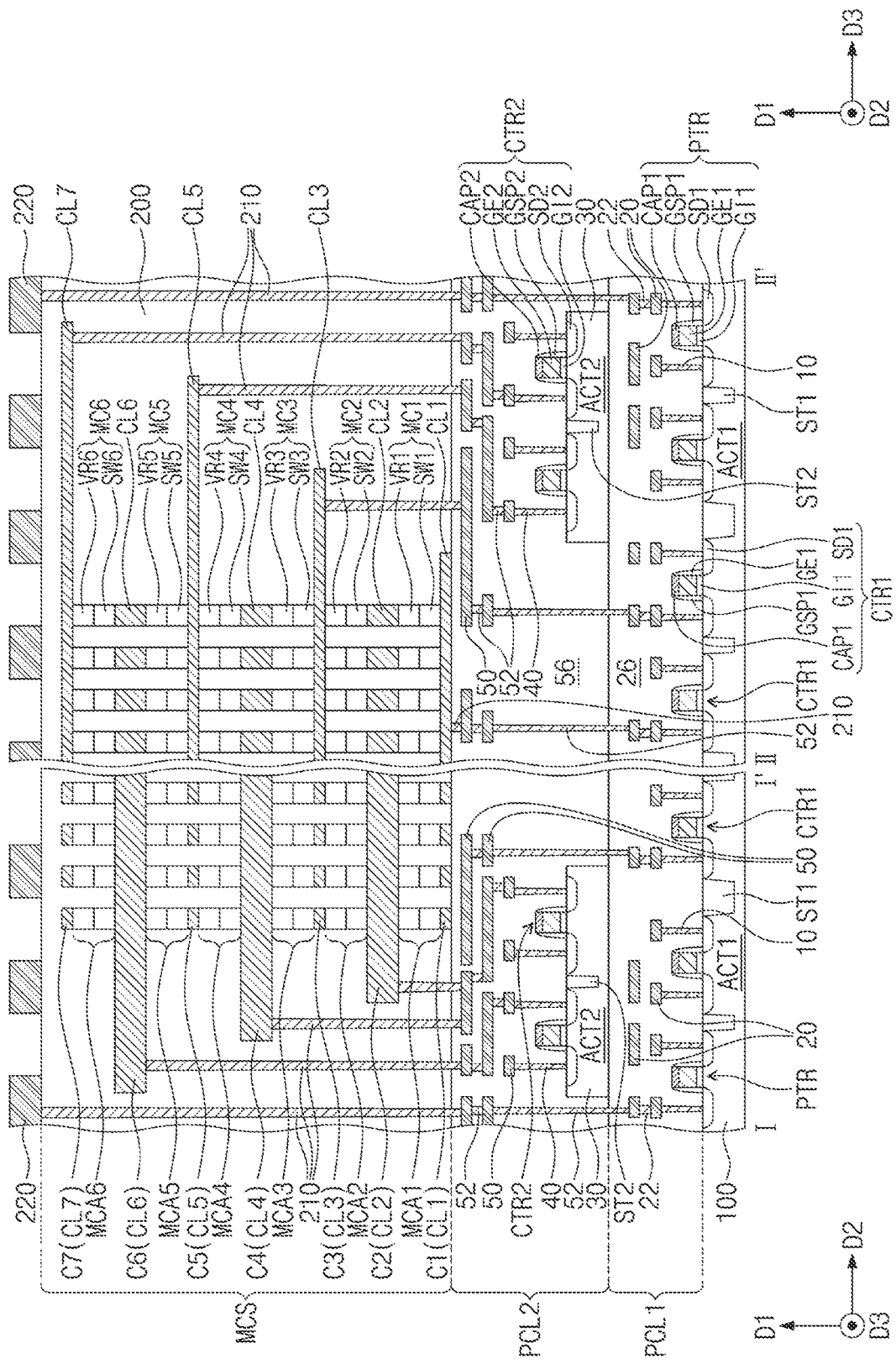
FIG. 6 is a cross-sectional view of a variable resistance memory device according to an embodiment and corresponding to lines I-I' and II-II' of FIG. 3.

FIG. 6 is a cross-sectional view of a variable resistance memory device according to an embodiment and corresponding to lines I-I' and of FIG. 3. For the sake of brevity, features, which are different from the variable resistance memory device described with reference to FIGS. 1 to 4, will be mainly described below.

Referring to FIGS. 3 and 6, the memory cell structure MCS may be disposed on the second peripheral circuit layer PCL2. The memory cell structure MCS may include conductive layers C1, C2, C3, C4, C5, C6, and C7 and memory cell arrays MCA1, MCA2, MCA3, MCA4, MCA5, and MCA6, which are alternatingly stacked in the first direction D1.

The conductive layers C1, C2, C3, C4, C5, C6, and C7 may include a first conductive layer C1, a second conductive layer C2, a third conductive layer C3, a fourth conductive layer C4, a fifth conductive layer C5, a sixth conductive layer C6, and a seventh conductive layer C7, which are vertically spaced apart from each other in the first direction D1. The first to seventh conductive layers C1, C2, C3, C4, C5, C6, and C7 may be configured to have substantially the same features as the first to seventh conductive layers C1, C2, C3, C4, C5, C6, and C7 described with reference to FIGS. 3 and 5. The memory cell arrays MCA1, MCA2, MCA3, MCA4, MCA5, and MCA6 may include a first memory cell array MCA1, a second memory cell array MCA2, a third memory cell array MCA3, a fourth memory cell array MCA4, a fifth memory cell array MCA5, and a sixth memory cell array MCA6, which are stacked in the first direction D1. The first to sixth memory cell arrays MCA1, MCA2, MCA3, MCA4, MCA5, and MCA6 may be configured to have substantially the same features as the first to sixth memory cell arrays MCA1, MCA2, MCA3, MCA4, MCA5, and MCA6 described with reference to FIGS. 3 and 5.

In some embodiments, each of the sixth conductive lines CL6 of the sixth conductive layer C6 may be connected to corresponding ones of the second interconnection patterns 50 and 52 of the second peripheral circuit layer PCL2 through a corresponding one of the conductive contacts 210. Each of the sixth conductive lines CL6 may be electrically connected to a terminal of a corresponding one of the second core transistors CTR2 of the second peripheral circuit layer PCL2 through the corresponding second interconnection patterns 50 and 52. In some embodiments, to perform the write, read, and erase operations on the fifth memory cells MC5, some of the second core transistors CTR2 of the second peripheral circuit layer PCL2 may be configured to control the fifth conductive lines CL5 and the sixth conductive lines CL6.

Each of the seventh conductive lines CL7 of the seventh conductive layer C7 may be connected to corresponding ones of the second interconnection patterns 50 and 52 of the second peripheral circuit layer PCL2 through a corresponding one of the conductive contacts 210. Each of the seventh conductive lines CL7 may be electrically connected to a terminal of a corresponding one of the second core transistors CTR2 of the second peripheral circuit layer PCL2 through the corresponding second interconnection patterns 50 and 52. In some embodiments, to perform the write, read, and erase operations on the sixth memory cells MC6, some of the second core transistors CTR2 of the second peripheral circuit layer PCL2 may be configured to control the sixth conductive lines CL6 and the seventh conductive lines CL7.

In some embodiments, to perform the write, read, and erase operations on the first to sixth memory cells MC1, MC2, MC3, MC4, MC5, and MC6, the first core transistors CTR1 of the first peripheral circuit layer PCL1 may be configured to control the first to third conductive lines CL1, CL2, and CL3, and the second core transistors CTR2 of the second peripheral circuit layer PCL2 may be configured to control the fourth to seventh conductive lines CL4, CL5, CL6, and CL7. The peripheral transistors PTR of the first peripheral circuit layer PCL1 may be connected to the first core transistors CTR1 and the second core transistors CTR2 through corresponding ones of the first interconnection patterns 20 and 22 and corresponding ones of the second interconnection patterns 50 and 52 and may constitute a peripheral circuit, which is used to operate the first to sixth memory cells MC1, MC2, MC3, MC4, MC5, and MC6.

Figure 7:
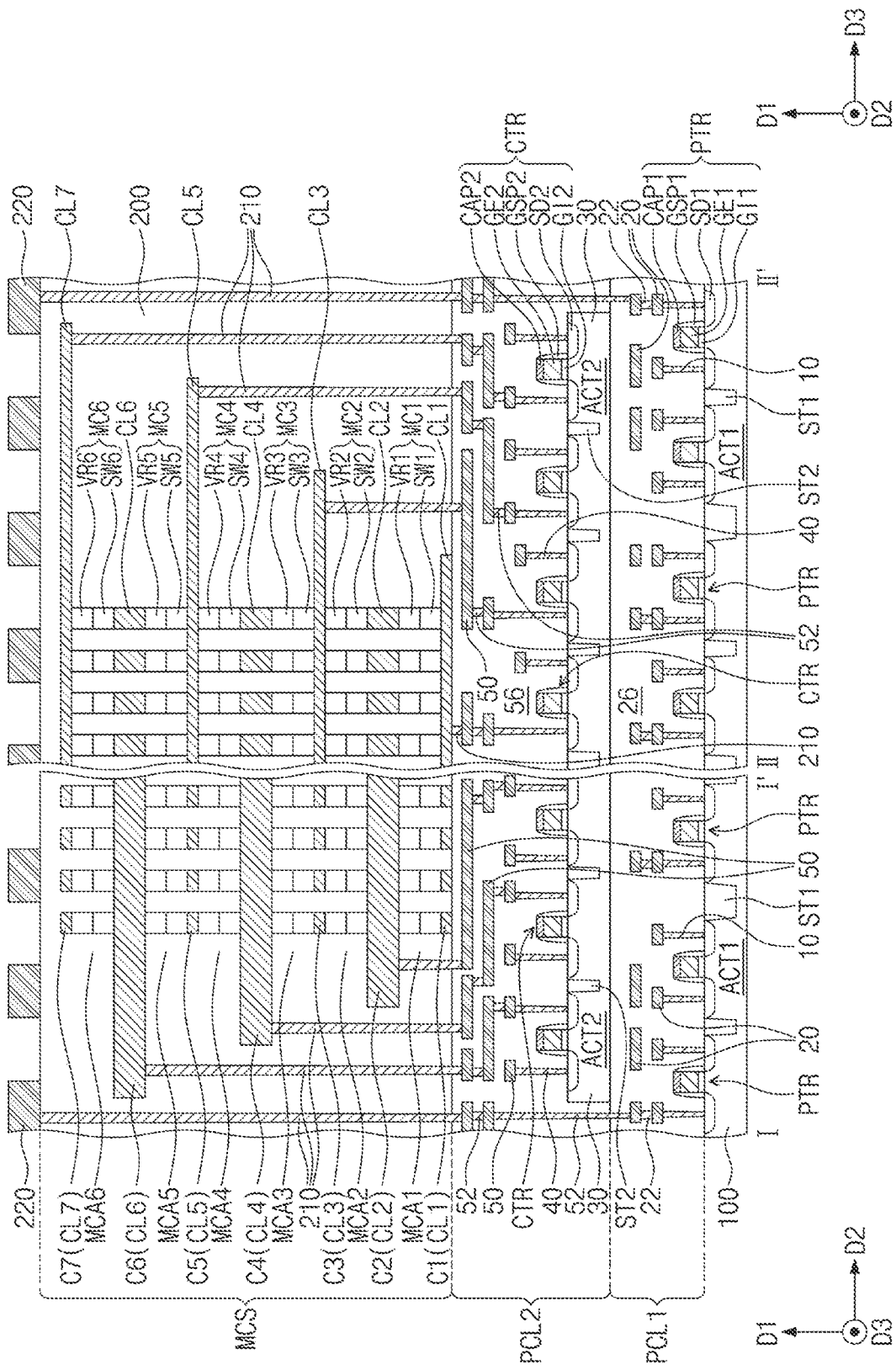
FIG. 7 is a cross-sectional view of a variable resistance memory device according to an embodiment and corresponding to lines I-I' and II-II' of FIG. 3.

FIG. 7 is a cross-sectional view of a variable resistance memory device according to an embodiment and corresponding to lines I-I' and of FIG. 3. For the sake of brevity, features, which are different from the variable resistance memory device described with reference to FIGS. 1 to 4, will be mainly described below.

Referring to FIGS. 3 and 7, the first peripheral circuit layer PCL1 may include first transistors PTR on the substrate 100. In some embodiments, the first transistors PTR may be peripheral transistors PTR. The second peripheral circuit layer PCL2 may include a first semiconductor layer 30 and second transistors CTR on the first semiconductor layer 30. In some embodiments, the second transistors CTR may be core transistors CTR.

The memory cell structure MCS may be disposed on the second peripheral circuit layer PCL2. The memory cell structure MCS may include conductive layers C1, C2, C3, C4, C5, C6, and C7 and memory cell arrays MCA1, MCA2, MCA3, MCA4, MCA5, and MCA6, which are alternatingly stacked in the first direction D1 perpendicular to the top surface 100U of the substrate 100. The conductive layers C1, C2, C3, C4, C5, C6, and C7 may include a first conductive layer C1, a second conductive layer C2, a third conductive layer C3, a fourth conductive layer C4, a fifth conductive layer C5, a sixth conductive layer C6, and a seventh conductive layer C7, which are vertically spaced apart from each other in the first direction D1. The first to seventh conductive layers C1, C2, C3, C4, C5, C6, and C7 may be configured to have substantially the same features as the first to seventh conductive layers C1, C2, C3, C4, C5, C6, and C7 described with reference to FIGS. 3 and 5. The memory cell arrays MCA1, MCA2, MCA3, MCA4, MCA5, and MCA6 may include a first memory cell array MCA1, a second memory cell array MCA2, a third memory cell array MCA3, a fourth memory cell array MCA4, a fifth memory cell array MCA5, and a sixth memory cell array MCA6, which are stacked in the first direction D1. The first to sixth memory cell arrays MCA1, MCA2, MCA3, MCA4, MCA5, and MCA6 may be configured to have substantially the same features as the first to sixth memory cell arrays MCA1, MCA2, MCA3, MCA4, MCA5, and MCA6 described with reference to FIGS. 3 and 5.

In some embodiments, each of the first conductive lines CL1 of the first conductive layer C1 may be connected to corresponding ones of the second interconnection patterns 50 and 52 of the second peripheral circuit layer PCL2 through a corresponding one of the conductive contacts 210. Each of the first conductive lines CL1 may be electrically connected to a terminal of a corresponding one of the core transistors CTR of the second peripheral circuit layer PCL2 through the corresponding second interconnection patterns 50 and 52. Each of the second conductive lines CL2 of the second conductive layer C2 may be connected to corresponding ones of the second interconnection patterns 50 and 52 of the second peripheral circuit layer PCL2 through a corresponding one of the conductive contacts 210 and may be electrically connected to a terminal of a corresponding one of the core transistors CTR of the second peripheral circuit layer PCL2 through the corresponding second interconnection patterns 50 and 52.

Each of the third conductive lines CL3 of the third conductive layer C3 may be connected to corresponding ones of the second interconnection patterns 50 and 52 of the second peripheral circuit layer PCL2 through a corresponding one of the conductive contacts 210 and may be electrically connected to a terminal of a corresponding one of the core transistors CTR of the second peripheral circuit layer PCL2 through the corresponding second interconnection patterns 50 and 52. Each of the fourth conductive lines CL4 of the fourth conductive layer C4 may be connected to corresponding ones of the second interconnection patterns 50 and 52 of the second peripheral circuit layer PCL2 through a corresponding one of the conductive contacts 210 and may be electrically connected to a terminal of a corresponding one of the core transistors CTR of the second peripheral circuit layer PCL2 through the corresponding second interconnection patterns 50 and 52.

Each of the fifth conductive lines CL5 of the fifth conductive layer C5 may be connected to corresponding ones of the second interconnection patterns 50 and 52 of the second peripheral circuit layer PCL2 through a corresponding one of the conductive contacts 210 and may be electrically connected to a terminal of a corresponding one of the core transistors CTR of the second peripheral circuit layer PCL2 through the corresponding second interconnection patterns 50 and 52. Each of the sixth conductive lines CL6 of the sixth conductive layer C6 may be connected to corresponding ones of the second interconnection patterns 50 and 52 of the second peripheral circuit layer PCL2 through a corresponding one of the conductive contacts 210 and may be electrically connected to a terminal of a corresponding one of the core transistors CTR of the second peripheral circuit layer PCL2 through the corresponding second interconnection patterns 50 and 52.

Each of the seventh conductive lines CL7 of the seventh conductive layer C7 may be connected to corresponding ones of the second interconnection patterns 50 and 52 of the second peripheral circuit layer PCL2 through a corresponding one of the conductive contacts 210 and may be electrically connected to a terminal of a corresponding one of the core transistors CTR of the second peripheral circuit layer PCL2 through the corresponding second interconnection patterns 50 and 52.

In some embodiments, to perform the write, read, and erase operations on the first to sixth memory cells MC1, MC2, MC3, MC4, MC5, and MC6, the core transistors CTR of the second peripheral circuit layer PCL2 may be configured to control the first to seventh conductive lines CL1, CL2, CL3, CL4, CL5, CL6, and CL7. The peripheral transistors PTR of the first peripheral circuit layer PCL1 may be connected to the core transistors CTR through corresponding ones of the first interconnection patterns 20 and 22 and corresponding ones of the second interconnection patterns 50 and 52 and may constitute a peripheral circuit, which is used to operate the first to sixth memory cells MC1, MC2, MC3, MC4, MC5, and MC6.

Figure 8:
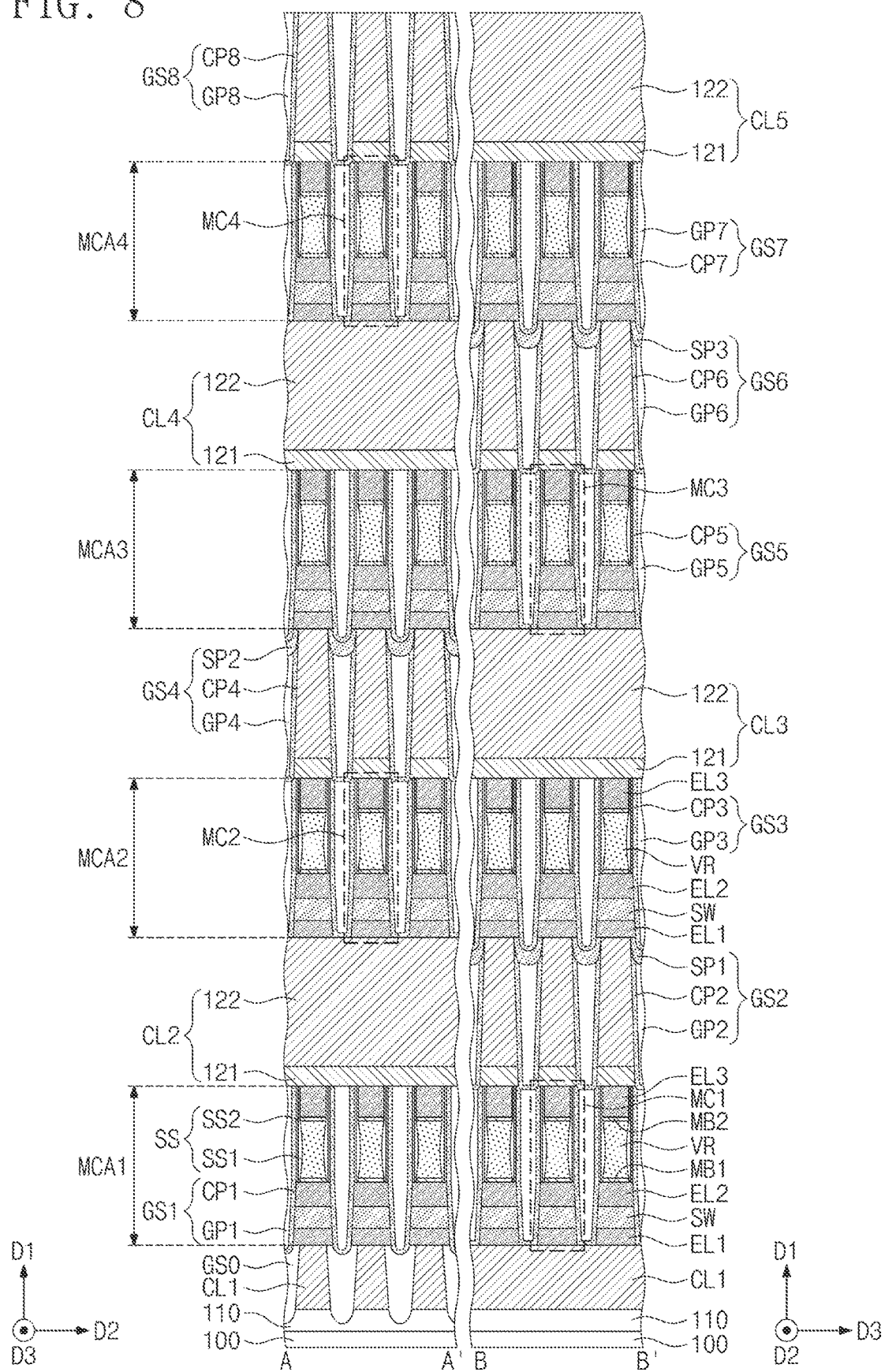
FIG. 8 is a cross-sectional view of a memory cell structure of FIG. 4, according to an embodiment.

FIG. 8 is a cross-sectional view of a memory cell structure of FIG. 4, according to an embodiment.

Referring to FIG. 8, the memory cell structure MCS may include a plurality of memory cell arrays MCA1, MCA2, MCA3, and MCA4, which are sequentially stacked. A first memory cell array MCA1 may be disposed between first conductive lines CL1 and second conductive lines CL2 and may include first memory cells MC1, which are respectively disposed at intersections between the first conductive lines CL1 and the second conductive lines CL2. A second memory cell array MCA2 may be disposed between the second conductive lines CL2 and a third conductive lines CL3 and may include second memory cells MC2, which are respectively disposed at intersections between the second conductive lines CL2 and the third conductive lines CL3. A third memory cell array MCA3 may be disposed between the third conductive lines CL3 and a fourth conductive lines CL4 and may include third memory cells MC3, which are respectively disposed at intersections between the third conductive lines CL3 and the fourth conductive lines CL4. A fourth memory cell array MCA4 may be disposed between the fourth conductive lines CL4 and a fifth conductive lines CL5 and may include fourth memory cells MC4, which are respectively disposed at intersections between the fourth conductive lines CL4 and the fifth conductive lines CL5. The first to fifth conductive lines CL1, CL2, CL3, CL4, and CL5 may be configured to have substantially the same features as the first to fifth conductive lines CL1, CL2, CL3, CL4, and CL5 described with reference to FIGS. 3 and 4. The first to fifth conductive lines CL1, CL2, CL3, CL4, and CL5 may be formed of or include at least one conductive material (e.g., tungsten, copper, or aluminum) and/or a conductive metal nitride (e.g., TiN or WN).

An interlayer insulating layer 110 may be provided between the first conductive lines CL1 and the substrate 100. The interlayer insulating layer 110 may be formed of or include at least one of, e.g., silicon oxide, silicon nitride, or silicon oxynitride. A lower filling structure GS0 may be disposed between the first conductive lines CL1 and may be extended along the first conductive lines CL1 or in the third direction D3. The lower filling structure GS0 may be formed of or include at least one of, e.g., silicon oxide, silicon nitride, or silicon oxynitride. The lower filling structure GS0 may be extended into an upper portion of the interlayer insulating layer 110.

Each of the first memory cells MC1 may include a switching pattern SW and a variable resistance pattern VR, which are stacked in the first direction D1 between a corresponding pair of the first and second conductive lines CL1 and CL2. Each of the first memory cells MC1 may include a first electrode EL1 between the corresponding first conductive line CL1 and the switching pattern SW, a second electrode EL2 between the switching pattern SW and the variable resistance pattern VR, a first metal pattern MB1 between the second electrode EL2 and the variable resistance pattern VR, a third electrode EL3 between the variable resistance pattern VR and the corresponding second conductive line CL2, and a second metal pattern MB2 between the variable resistance pattern VR and the third electrode EL3.

The variable resistance pattern VR may include a material exhibiting a variable resistance property, and in this case, the variable resistance pattern VR may be used as a data-storing element. In some embodiments, the variable resistance pattern VR may include a material whose phase can be changed to one of crystalline and amorphous structures, depending on its temperature. The variable resistance pattern VR may include a compound containing at least one of chalcogen elements (e.g., Te and Se) and at least one of Ge, Sb, Bi, Pb, Sn, Ag, As, S, Si, In, or Ga.

In an embodiment, the variable resistance pattern VR may be formed of or include at least one of, e.g., GeTe, GeSe, GeS, SbSe, SbTe, SbS, SbSe, SnSb, InSe, InSb, AsTe, AlTe, GaSb, AlSb, BiSb, ScSb, Ysb, CeSb, DySb, or NdSb. In an embodiment, the variable resistance pattern VR may be formed of or include at least one of, e.g., GeSbSe, AlSbTe, AlSbSe, SiSbSe, SiSbTe, GeSeTe, InGeTe, GeSbTe, GeAsTe, SnSeTe, GeGaSe, BiSbSe, GaSeTe, InGeSb, GaSbSe, GaSbTe, InSbSe, InSbTe, SnSbSe, SnSbTe, ScSbTe, ScSbSe, ScSbS, YSbTe, YSbSe, YSbS, CeSbTe, CeSbSe, CeSbS, DySbTe, DySbSe, DySbS, NdSbTe, NdSbSe, or NdSbS. In an embodiment, the variable resistance pattern VR may be formed of or include at least one of, e.g., GeSbTeS, BiSbTeSe, AgInSbTe, GeSbSeTe, GeSnSbTe, SiGeSbTe, SiGeSbSe, SiGeSeTe, BiGeSeTe, BiSiGeSe, BiSiGeTe, GeSbTeBi, GeSbSeBi, GeSbSeIn, GeSbSeGa, GeSbSeAl, GeSbSeTl, GeSbSeSn, GeSbSeZn, GeSbTeIn, GeSbTeGa, GeSbTeAl, GeSbTeTl, GeSbTeSn, GeSbTeZn, ScGeSbTe, ScGeSbSe, ScGeSbS, YGeSbTe, YGeSbSe, YGeSbS, CeGeSbTe, CeGeSbSe, CeGeSbS, DyGeSbTe, DyGeSbSe, DyGeSbS, NdGeSbTe, NdGeSbSe, or NdGeSbS. In an embodiment, the variable resistance pattern VR may be formed of or include at least one of, e.g., InSbTeAsSe, GeScSbSeTe, GeSbSeTeS, GeScSbSeS, GeScSbTeS, GeScSeTeS, GeScSbSeP, GeScSbTeP, GeSbSeTeP, GeScSbSeIn, GeScSbSeGa, GeScSbSeAl, GeScSbSeTl, GeScSbSeZn, GeScSbSeSn, GeScSbTeIn, GeScSbTeGa, GeSbAsTeAl, GeScSbTeTl, GeScSbTeZn, GeScSbTeSn, GeSbSeTeIn, GeSbSeTeGa, GeSbSeTeAl, GeSbSeTeTl, GeSbSeTeZn, GeSbSeTeSn, GeSbSeSZn, GeSbSeSGa, GeSbSeSAl, GeSbSeSTl, GeSbSeSZn, GeSb-SeSSn, GeSbTeSIn, GeSbTeSGa, GeSbTeSAl, GeSbTeSTl, GeSbTeSZn, GeSbTeSSn, GeSbSeInGa, GeSbSeInAl, GeSbSeInTl, GeSbSeInZn, GeSbSeInSn, GeSbSeGaAl, GeSbSeGaTl, GeSbSeGaZn, GeSbSeGaSn, GeSbSeAlTl, GeSbSeAlZn, GeSb SeAlSn, GeSbSeTlZn, GeSbSeTlSn, or GeSbSeZnSn. The variable resistance pattern VR may further include at least one of, e.g., B, C, N, O, P, Cd, W, Ti, Hf, or Zr.

In an embodiment, the variable resistance pattern VR may be composed of a single layer or may have a multi-layered structure including a plurality of stacked layers. In an embodiment, the variable resistance pattern VR may have a super lattice structure, in which a germanium-containing layer and a germanium-free layer are repeatedly stacked. As an example, the variable resistance pattern VR may have a structure, in which GeTe and SbTe layers are repeatedly stacked.

In an embodiment, the variable resistance pattern VR may be formed of or include at least one of, e.g., perovskite compounds or conductive metal oxides. As an example, the variable resistance pattern VR may be formed of or include at least one of niobium oxide, titanium oxide, nickel oxide, zirconium oxide, vanadium oxide, PCMO((Pr,Ca)MnO3), strontium-titanium oxide, barium-strontium-titanium oxide, strontium-zirconium oxide, barium-zirconium oxide, or barium-strontium-zirconium oxide. In the case where the variable resistance pattern VR contains a transition metal oxide, a dielectric constant of the variable resistance patterns VR may be higher than that of a silicon oxide layer.

In an embodiment, the variable resistance pattern VR may have a double-layered structure including a conductive metal oxide layer and a tunnel insulating layer or a triple-layered structure including a first conductive metal oxide layer, a tunnel insulating layer, and a second conductive metal oxide layer. In this case, the tunnel insulating layer may be formed of or include aluminum oxide, hafnium oxide, or silicon oxide.

The variable resistance pattern VR may be provided to have recess portions, which are formed on its side surface. The recess portions may be portions of the side surface of the variable resistance pattern VR, which are recessed relative to corresponding side surfaces of the first and second metal patterns MB1 and MB2.

In an embodiment, the switching pattern SW may include a silicon diode or an oxide diode having a rectifying property. For example, the switching pattern SW may be composed of a silicon diode, in which a p-type silicon layer and an n-type silicon layer are in contact with each other, or may be composed of an oxide diode, in which a p-type NiOx layer and an n-type TiOx layer are in contact with each other or a p-type CuOx layer and an n-type TiOx layer are in contact with each other. As another example, the switching pattern SW may include an oxide material (e.g., ZnOx, MgOx, or AlOx), which has a high-resistance or current-blocking property under conditions below a specific voltage and has a low-resistance or current-conduction property under conditions above the specific voltage.

As another example, the switching pattern SW may be an ovonic threshold switch (OTS) device having a bi-directional property. In this case, the switching pattern SW may include a chalcogenide material, which is in a substantially amorphous state. Here, the substantially amorphous state does not exclude a crystalline structure of an object, in which crystalline grains locally exist or a locally crystallized portion exists. In this case, the switching pattern SW may include a compound containing at least one of chalcogen elements, e.g., Te and Se, and at least one of, e.g., Ge, Sb, Bi, Al, Pb, Sn, Ag, As, S, Si, In, Ti, Ga, or P.

In an embodiment, the switching pattern SW may be formed of or include at least one of, e.g., GeSe, GeS, AsSe, AsTe, AsS, SiTe, SiSe, SiS, GeAs, SiAs, SnSe, or SnTe. In an embodiment the switching pattern SW may be formed of or include at least one of, e.g., GeAsTe, GeAsSe, AlAsTe, AlAsSe, SiAsSe, SiAsTe, GeSeTe, GeSeSb, GaAsSe, GaAsTe, InAsSe, InAsTe, SnAsSe, or SnAsTe. In an embodiment, the switching pattern SW may be formed of or include at least one of, e.g., GeSiAsTe, GeSiAsSe, GeSiSeTe, GeSeTeSb, GeSiSeSb, GeSiTeSb, GeSeTeBi, GeSiSeBi, GeSiTeBi, GeAsSeSb, GeAsTeSb, GeAsTeBi, GeAsSeBi, GeAsSeIn, GeAsSeGa, GeAsSeAl, GeAsSeTl, GeAsSeSn, GeAsSeZn, GeAsTeIn, GeAsTeGa, GeAsTeAl, GeAsTeTl, GeAsTeSn, or GeAsTeZn. In an embodiment, the switching pattern SW may be formed of or include at least one of, e.g., GeSiAsSeTe, GeAsSeTeS, GeSiAsSeS, GeSiAsTeS, GeSiSeTeS, GeSiAsSeP, GeSiAsTeP, GeAsSeTeP, GeSiAsSeIn, GeSiAsSeGa, GeSiAsSeAl, GeSiAsSeTl, GeSiAsSeZn, GeSiAsSeSn, GeSiAsTeIn, GeSiAsTeGa, GeSiAsTeAl, GeSiAsTeTl, GeSiAsTeZn, GeSiAsTeSn, GeAsSeTeIn, GeAsSeTeGa, GeAsSeTeAl, GeAsSeTeTl, GeAsSeTeZn, GeAsSeTeSn, GeAsSeSIn, GeAsSeSGa, GeAsSeSAl, GeAsSeSTl, GeAsSeSZn, GeAsSeSSn, GeAsTeSIn, GeAsTeSGa, GeAsTeSAl, GeAsTeSTl, GeAsTeSZn, GeAsTeSSn, GeAsSeInGa, GeAsSeInAl, GeAsSeInTl, GeAsSeInZn, GeAsSeInSn, GeAsSeGaAl, GeAsSeGaTl, GeAsSeGaZn, GeAsSeGaSn, GeAsSeAlTl, GeAsSeAlZn, GeAsSEAlSn, GeAsSeTlZn, GeAsSeTlSn, or GeAsSeZnSn. In an embodiment, the switching pattern SW may be formed of or include at least one of, e.g., GeSiAsSeTeS, GeSiAsSeTeIn, GeSiAsSeTeGa, GeSiAsSeTeAl, GeSiAsSeTeTl, GeSiAsSeTeZn, GeSiAsSeTeSn, GeSiAsSeTeP, GeSiAsSeSIn, GeSiAsSeSGa, GeSiAsSeSAl, GeSiAsSeSTl, GeSiAsSeSZn, GeSiAsSeSSn, GeAsSeTeSIn, GeAsSeTeSGa, GeAsSeTeSAl, GeAsSeTeSTl, GeAsSeTeSZn, GeAsSeTeSSn, GeAsSeTePIn, GeAsSeTePGa, GeAsSeTePAl, GeAsSeTePTl, GeAsSeTePZn, GeAsSeTePSn, GeSiAsSeInGa, GeSiAsSeInAl, GeSiAsSeInTl, GeSiAsSeInZn, GeSiAsSeInSn, GeSiAsSeGaAl, GeSiAsSeGaTl, GeSiAsSeGaZn, GeSiAsSeGaSn, GeSiAsSeAlSn, GeAsSeTeInGa, GeAsSeTeInAl, GeAsSeTeInTl, GeAsSeTeInZn, GeAsSeTeInSn, GeAsSeTeGaAl, GeAsSeTeGaTl, GeAsSeTeGaZn, GeAsSeTeGaSn, GeAsSeTeAlSn, GeAsSeSInGa, GeAsSeSInAl, GeAsSeSInTl, GeAsSeSInZn, GeAsSeSInSn, GeAsSeSGaAl, GeAsSeSGaTl, GeAsSeSGaZn, GeAsSeSGaSn, or GeAsSeSAlSn. The switching pattern SW may further include at least one of, e.g., B, C, N, or O. The switching pattern SW may be composed of a single layer or may have a multi-layered structure including a plurality of stacked layers.

The first to third electrodes EL1, EL2, and EL3 may be formed of or include at least one conductive material. As an example, the first to third electrodes EL1, EL2, and EL3 may be carbon electrodes, which are formed to contain carbon. In an embodiment, the first to third electrodes EL1, EL2, and EL3 may be formed of or include at least one of metallic materials and/or metal nitrides.

The first metal pattern MB1 and the second metal pattern MB2 may be provided to cover a top surface and a bottom surface of the variable resistance pattern VR, respectively, and to prevent a material of the variable resistance pattern VR from being diffused into neighboring elements. In addition, the first metal pattern MB1 may be provided between the variable resistance pattern VR and the switching pattern SW and, in this case, a contact resistance between the variable resistance pattern VR and the switching pattern SW may be reduced. The first and second metal patterns MB1 and MB2 may be formed of or include at least one of, e.g., W, Ti, Al, Cu, C, CN, TiN, TiAlN, TiSiN, TiCN, WN, CoSiN, WSiN, TaN, TaCN, or TaSiN.

Each of the first memory cells MC1 may further include a spacer structure SS. The spacer structure SS may cover side surfaces of each of the first metal pattern MB1, the second metal pattern MB2, the variable resistance pattern VR, and the third electrode EL3. A bottom surface of the spacer structure SS may be in contact with a top surface of the second electrode EL2. The spacer structure SS may be formed of or include at least one of, e.g., silicon oxide, silicon nitride, or silicon oxynitride. As an example, the spacer structure SS may include a first spacer SS1 and a second spacer SS2 which are formed of or include respectively different materials. The first spacer SS1 may fill recess portions of the variable resistance pattern VR. The second spacer SS2 may cover a side surface of the first spacer SS1.

A first filling structure GS1 may be interposed between the first memory cells MC1. The first filling structure GS1 may include a first capping pattern CP1 and a first filling pattern GP1. As an example, the first capping pattern CP1 may be provided to conformally cover side surfaces of the first memory cells MC1. A bottom surface of the first capping pattern CP1 may be in contact with top surfaces of the lower filling structure GS0 and the first conductive lines CL1. A portion of the first capping pattern CP1 on the lower filling structure GS0 may be downwardly extended to a level that is lower than top surfaces of the first conductive lines CL1. In other words, a lower portion of the first capping pattern CP1 may be inserted into an upper portion of the lower filling structure GS0. The first filling pattern GP1 may be provided on the first capping pattern CP1. The first filling pattern GP1 may be spaced apart from the first memory cells MC1 with the first capping pattern CP1 interposed therebetween. The first capping pattern CP1 may be formed of or include at least one of, e.g., SiN, SiO$_2$, SiON, SiBN, SiCN, SIOCN, AL$_2$O$_3$, AN, or AlON. The first filling pattern GP1 may be formed of or include at least one of, e.g., SiN, SiON, SiC, SiCN, SiOC, SiOCN, SiO$_2$, or Al$_2$O$_3$.

Each of the second to fourth memory cells MC2, MC3, and MC4 may be configured to have substantially the same features as the first memory cell MC1. Each of the second to fifth conductive lines CL2, CL3, CL4, and CL5 may include a barrier pattern 121 and a metal pattern 122. The barrier pattern 121 may be formed of or include at least one metal nitride (e.g., TiN, WN, or TaN). The metal pattern 122 may be formed of or include at least one metallic material (e.g., tungsten, titanium, or tantalum).

A second filling structure GS2 may be interposed between the second conductive lines CL2. The second filling structure GS2 may include a second capping pattern CP2, a second filling pattern GP2, and a first supporting pattern SP1. The second capping pattern CP2 may cover side surfaces of an adjacent pair of the second conductive lines CL2 and may cover a top surface of the first filling structure GS1 exposed between the pair of the second conductive lines CL2. As an example, a bottom surface of the second capping pattern CP2 may be in contact with the first capping pattern CP1 and the first filling pattern GP1. The second filling pattern GP2 may be disposed on the second capping pattern CP2 to fill a space between the second conductive lines CL2. The second filling pattern GP2 may be enclosed by the second capping pattern CP2 and the first supporting pattern SP1. The first supporting pattern SP1 may be provided on the second capping pattern CP2 and the second filling pattern GP2 and between the second conductive lines CL2. A bottom surface and/or a top surface of the first supporting pattern SP1 may have a shape that is convex toward the substrate 100, when viewed in a cross-sectional view. The second capping pattern CP2, the second filling pattern GP2, and the first supporting pattern SP1 may be formed of or include different materials from each other. The second capping pattern CP2 may be formed of or include at least one of, e.g., SiN, SiO$_2$, SiON, SiBN, SiCN, SIOCN, AL$_2$O$_3$, AlN, or AlON. The second filling pattern GP2 may be formed of or include at least one of, e.g., SiN, SiON, SiC, SiCN, SiOC, SiOCN, SiO$_2$, or Al$_2$O$_3$. The first supporting pattern SP1 may be formed of or include at least one of, e.g., SiN, SiO$_2$, SiON, SiBN, SiCN, SIOCN, AL$_2$O$_3$, AlN, or AlON.

A third filling structure GS3 may be interposed between the second memory cells MC2. The third filling structure GS3 may include a third capping pattern CP3 and a third filling pattern GP3. In an embodiment, the third capping pattern CP3 may conformally cover side surfaces of the second memory cells MC2. The second capping pattern CP2 may be formed of or include at least one of, e.g., SiN, SiO$_2$, SiON, SiBN, SiCN, SIOCN, AL$_2$O$_3$, AlN, or AlON. The second filling pattern GP2 may be formed of or include at least one of, e.g., SiN, SiON, SiC, SiCN, SiOC, SiOCN, SiO$_2$, or Al$_2$O$_3$. A bottom surface of the third capping pattern CP3 may be in contact with top surfaces of the second filling structure GS2 and the second conductive lines CL2. A portion of the third capping pattern CP3 on the second filling structure GS2 may be downwardly extended to a level that is lower than top surfaces of the second conductive lines CL2. In other words, a lower portion of the third capping pattern CP3 may be inserted into a region between the second conductive lines CL2.

A fourth filling structure GS4 may be interposed between the third conductive lines CL3. The fourth filling structure GS4 may include a fourth capping pattern CP4, a fourth filling pattern GP4, and a second supporting pattern SP2. The fourth capping pattern CP4 may cover side surfaces of an adjacent pair of the third conductive lines CL3 and may cover a top surface of the third filling structure GS3 exposed between the pair of the third conductive lines CL3. As an example, a bottom surface of the fourth capping pattern CP4 may be in contact with the third capping pattern CP3 and the third filling pattern GP3. The fourth filling pattern GP4 may be on the fourth capping pattern CP4 to fill a space between the third conductive lines CL3. The fourth filling pattern GP4 may be enclosed by the fourth capping pattern CP4 and the second supporting pattern SP2. The second supporting pattern SP2 may be on the fourth capping pattern CP4 and the fourth filling pattern GP4 and between the third conductive lines CL3. A bottom surface and/or a top surface of the second supporting pattern SP2 may have a shape that is convex toward the substrate 100, when viewed in a cross-sectional view. The fourth capping pattern CP4, the fourth filling pattern GP4, and the second supporting pattern SP2 may be formed of or include different materials from each other. The fourth capping pattern CP4 may be formed of or include at least one of, e.g., SiN, SiO$_2$, SiON, SiBN, SiCN, SIOCN, AL$_2$O$_3$, AlN, or AlON. The fourth filling pattern GP4 may be formed of or include at least one of, e.g., SiN, SiON, SiC, SiCN, SiOC, SiOCN, SiO$_2$, or Al$_2$O$_3$. The second supporting pattern SP2 may be formed of or include at least one of, e.g., SiN, SiO$_2$, SiON, SiBN, SiCN, SIOCN, AL$_2$O$_3$, AlN, or AlON.

A fifth filling structure GS5 may be interposed between the third memory cells MC3, and a seventh filling structure GS7 may be interposed between the fourth memory cells MC4. The fifth and seventh filling structures GS5 and GS7 may be configured to have substantially the same features as the third filling structure GS3 described above. As an example, the fifth filling structure GS5 may include a fifth capping pattern CP5 and a fifth filling pattern GP5, and the seventh filling structure GS7 may include a seventh capping pattern CP7 and a seventh filling pattern GP7.

A sixth filling structure GS6 may be interposed between the fourth conductive lines CL4, and an eighth filling structure GS8 may be interposed between the fifth conductive lines CL5. The sixth and eighth filling structures GS6 and GS8 may be configured to have substantially the same features as the second and fourth filling structures GS2 and GS4 described above. As an example, the sixth filling structure GS6 may include a sixth capping pattern CP6, a sixth filling pattern GP6, and a third supporting pattern SP3, and the eighth filling structure GS8 may include an eighth capping pattern CP8 and an eighth filling pattern GP8.

Figure 9:
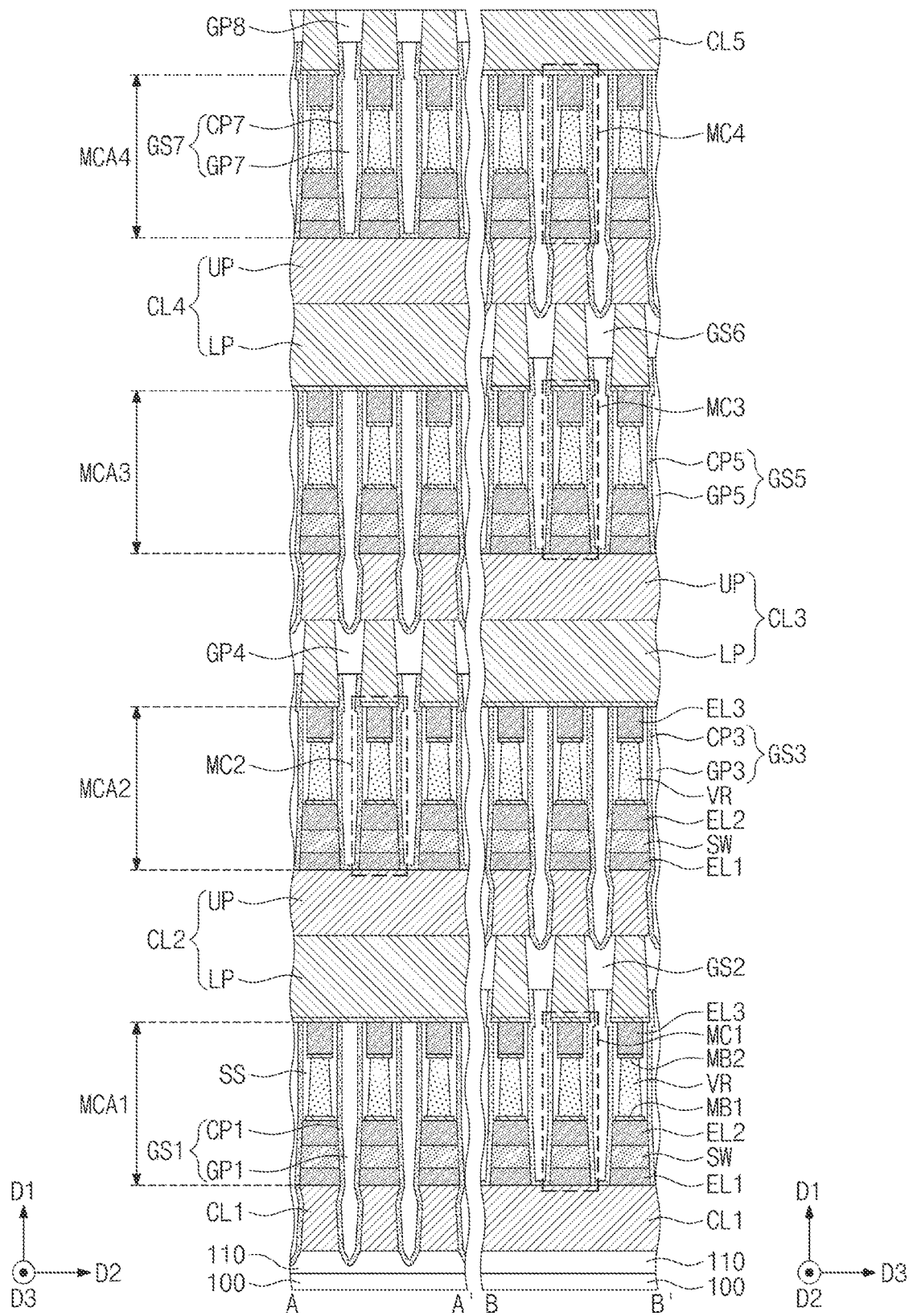
FIG. 9 is a cross-sectional view of the memory cell structure of FIG. 4, according to an embodiment.

FIG. 9 is a cross-sectional view of the memory cell structure of FIG. 4, according to an embodiment. For the sake of brevity, features, which are different from the memory cell structure of FIG. 8, will be mainly described below.

Referring to FIG. 9, each of the first memory cells MC1 may further include a spacer structure SS. The spacer structure SS may cover side surfaces of each of the first metal pattern MB1, the second metal pattern MB2, the variable resistance pattern VR, and the third electrode EL3. A bottom surface of the spacer structure SS may be in contact with a top surface of the second electrode EL2. The spacer structure SS may include at least one of, e.g., a silicon oxide layer, a silicon nitride layer, or a silicon oxynitride layer. Each of the second to fourth memory cells MC2, MC3, and MC4 may have substantially the same features as each of the first memory cells MC1.

A first filling structure GS1 may be interposed between the first memory cells MC1 and between the first conductive lines CL1. The first filling structure GS1 may include a first capping pattern CP1 and a first filling pattern GP1. In an embodiment, the first capping pattern CP1 may be provided to conformally cover side surfaces of the first memory cells MC1 and side surfaces of the first conductive lines CL1. The first capping pattern CP1 may be extended from a region between the first conductive lines CL1 to an upper portion of the interlayer insulating layer 110. The first filling pattern GP1 may be provided on the first capping pattern CP1. The first filling pattern GP1 may be spaced apart from the first memory cells MC1 and the first conductive lines CL1 with the first capping pattern CP1 interposed therebetween. The first filling structure GS1 may be extended into a region between lower portions LP of the second conductive lines CL2. For example, a portion of the first capping pattern CP1 may be provided to conformally cover side surfaces of the lower portions LP of the second conductive lines CL2, and a portion of the second filling pattern GP2 may be extended into the region between the lower portions LP of the second conductive lines CL2.

A second filling structure GS2 may be interposed between the lower portions LP of the second conductive lines CL2. The second filling structure GS2 may be disposed on the first filling structure GS1 to fill a space between the lower portions LP of the second conductive lines CL2. The second filling structure GS2 may be formed of or include, e.g., oxide, nitride, and/or oxynitride.

A third filling structure GS3 may be interposed between the second memory cells MC2 and between upper portions UP of the second conductive lines CL2. The third filling structure GS3 may include a third capping pattern CP3 and a third filling pattern GP3. As an example, the third capping pattern CP3 may be provided to conformally cover side surfaces of the second memory cells MC2 and side surfaces of the upper portions UP of the second conductive lines CL2. Between the second conductive lines CL2, the third capping pattern CP3 may be extended into an upper portion of the second filling structure GS2. The third filling pattern GP3 may be provided on the third capping pattern CP3. The third filling pattern GP3 may be spaced apart from the second memory cells MC2 and the upper portions UP of the second conductive lines CL2 with the third capping pattern CP3 interposed therebetween. The third filling structure GS3 may be extended into a region between lower portions LP of the third conductive lines CL3. For example, the third capping pattern CP3 may conformally cover side surfaces of the lower portions LP of the third conductive lines CL3, and the third filling pattern GP3 may be extended into the region between the lower portions LP of the third conductive lines CL3.

A fourth filling structure GS4 may be interposed between the lower portions LP of the third conductive lines CL3. The fourth filling structure GS4 may be disposed on the third filling structure GS3 to fill a space between the lower portions LP of the third conductive lines CL3. The fourth filling structure GS4 may be formed of or include, e.g., oxide, nitride, and/or oxynitride.

A fifth filling structure GS5 may be interposed between the third memory cells MC3 and between upper portions UP of the third conductive lines CL3, and a seventh filling structure GS7 may be interposed between the fourth memory cells MC4 and between upper portions UP of the fourth conductive lines CL4. The fifth and seventh filling structures GS5 and GS7 may be provided to have substantially the same structure as the third filling structure GS3 described above. For example, the fifth filling structure GS5 may include a fifth capping pattern CP5 and a fifth filling pattern GP5, and the seventh filling structure GS7 may include a seventh capping pattern CP7 and a seventh filling pattern GP7.

A sixth filling structure GS6 may be interposed between lower portions LP of the fourth conductive lines CL4, and an eighth filling structure GS8 may be interposed between the fifth conductive lines CL5. The sixth and eighth filling structures GS6 and GS8 may be provided to have substantially the same structure as the second and fourth filling structures GS2 and GS4 described above.

Figure 10:
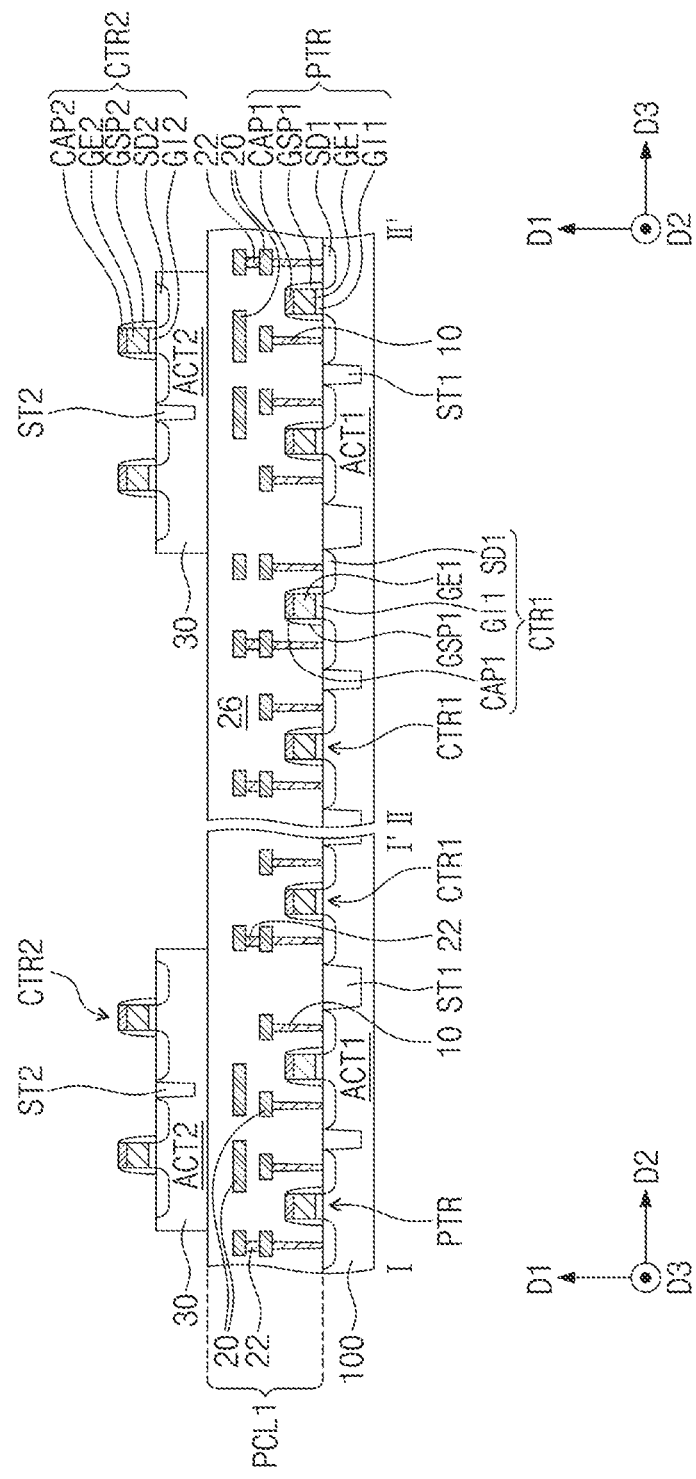
FIG. 10 is a cross-sectional view of a method of fabricating a variable resistance memory device according to an embodiment and corresponding to lines I-I' and II-II' of FIG. 3.

FIG. 10 is a cross-sectional view of a method of fabricating a variable resistance memory device according to an embodiment and corresponding to lines I-I' and of FIG. 3. For the sake of brevity, an element of the variable resistance memory device described with reference to FIGS. 1 to 7 may be identified by the same reference number without repeating an overlapping description thereof.

Referring to FIGS. 3 and 10, the first device isolation pattern ST1 may be formed in the substrate 100 to define the first active region ACT1. The first transistors PTR and CTR1 may be formed on the first active region ACT1. In an embodiment, the formation of the first transistors PTR and CTR1 may include forming the first gate insulating pattern GI1, the first gate electrode GE1, and the first gate capping pattern CAP1 sequentially stacked on the first active region ACT1, forming the first gate spacers GSP1 on side surfaces of the first gate electrode GE1, and forming the first source/drain regions SD1 in the first active region ACT1 and at both sides of the first gate electrode GE1.

The first lower interlayer insulating layer 26 may be formed on the substrate 100 to cover the first transistors PTR and CTR1. The first source/drain contacts 10, the first gate contacts, and the first interconnection patterns 20 and 22 may be formed in the first lower interlayer insulating layer 26. The first interconnection patterns 20 and 22 may include the first interconnection lines 20, which are vertically spaced apart from the substrate 100, and the first interconnection contacts 22, which are formed between the first interconnection lines 20.

The first transistors PTR and CTR1, the first source/drain contacts 10, the first gate contact, the first interconnection patterns 20 and 22, and the first lower interlayer insulating layer 26 may constitute the first peripheral circuit layer PCL1.

The first semiconductor layer 30 may be formed on the first lower interlayer insulating layer 26. The formation of the first semiconductor layer 30 may include depositing a semiconductor layer on the first lower interlayer insulating layer 26 and patterning the semiconductor layer. In some embodiments, the substrate 100 and the first semiconductor layer 30 may be formed using a SOI wafer.

The second device isolation pattern ST2 may be formed in the first semiconductor layer 30 to define the second active region ACT2. The second transistors CTR2 may be formed on the second active region ACT2. In an embodiment, the formation of the second transistors CTR2 may include forming the second gate insulating pattern GI2, the second gate electrode GE2, and the second gate capping pattern CAP2, which are sequentially stacked on the second active region ACT2, forming the second gate spacers GSP2 on side surfaces of the second gate electrode GE2, and forming the second source/drain regions SD2 in the second active region ACT2 and at both sides of the second gate electrode GE2.

Referring back to FIGS. 3 and 4, the second lower interlayer insulating layer 56 may be formed on the first lower interlayer insulating layer 26 to cover the first semiconductor layer 30 and the second transistors CTR2. The second source/drain contacts 40, the second gate contacts, and the second interconnection patterns 50 and 52 may be formed in the second lower interlayer insulating layer 56. The second interconnection patterns 50 and 52 may include the second interconnection lines 50, which are vertically spaced apart from the substrate 100, and the second interconnection contacts 52, which are formed between the second interconnection lines 50.

The first semiconductor layer 30, the second transistors CTR2, the second source/drain contacts 40, the second gate contact, the second interconnection patterns 50 and 52, and the second lower interlayer insulating layer 56 may constitute the second peripheral circuit layer PCL2. In some embodiments, as shown in FIG. 5, the third peripheral circuit layer PCL3 may be additionally formed on the second peripheral circuit layer PCL2. The third peripheral circuit layer PCL3 may be formed by substantially the same method as that for the second peripheral circuit layer PCL2.

Referring back to FIGS. 3 and 4, the first conductive lines CL1 may be formed on the second lower interlayer insulating layer 56, and second conductive lines CL2 may be formed on the first conductive lines CL1 to cross the first conductive lines CL1. The first memory cells MC1 may be respectively formed at intersections between the first conductive lines CL1 and the second conductive lines CL2. The third conductive lines CL3 may be formed on the second conductive lines CL2 to cross the second conductive lines CL2. The second memory cells MC2 may be respectively formed at intersections between the second conductive lines CL2 and the third conductive lines CL3. The fourth conductive lines CL4 may be disposed on the third conductive lines CL3 to cross the third conductive lines CL3. The third memory cells MC3 may be respectively formed at intersections between the third conductive lines CL3 and the fourth conductive lines CL4. The fifth conductive lines CL5 may be formed on the fourth conductive lines CL4 to cross the fourth conductive lines CL4. The fourth memory cells MC4 may be respectively formed at intersections between the fourth conductive lines CL4 and the fifth conductive lines CL5. The first to fifth conductive lines CL1, CL2, CL3, CL4, and CL5 and the first to fourth memory cells MC1, MC2, MC3, and MC4 may constitute the memory cell structure MCS.

The upper interlayer insulating layer 200 may be formed on the second lower interlayer insulating layer 56 to cover the memory cell structure MCS. The conductive contacts 210 may be formed in the upper interlayer insulating layer 200. The conductive contacts 210 may be formed to penetrate a portion of the upper interlayer insulating layer 200 and a portion of the second lower interlayer insulating layer 56 and to connect the first to fifth conductive lines CL1, CL2, CL3, CL4, and CL5 to the second interconnection patterns 50 and 52. The upper interconnection lines 220 may be formed on the upper interlayer insulating layer 200. Some of the upper interconnection lines 220 may be connected to corresponding ones of the second interconnection patterns 50 and 52 through corresponding ones of the conductive contacts 210.

According to an embodiment, a plurality of peripheral circuit layers may be stacked between a substrate and a memory cell structure, and the peripheral circuit layers may include transistors that are used to operate memory cell arrays in the memory cell structure. Since the peripheral circuit layers are vertically stacked between the substrate and the memory cell structure, it may be possible to easily integrate the transistors for operating the memory cell arrays on the substrate. Thus, it may be possible to easily realize a highly-integrated semiconductor device, e.g., a highly-integrated variable resistance memory device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A variable resistance memory device, comprising:
a substrate;
a memory cell structure on the substrate, the memory cell structure including:
conductive layers, each of the conductive layers including conductive lines spaced apart from each other in a direction parallel to a top surface of the substrate, and memory cell arrays, the memory cell arrays and the conductive layers being alternatingly stacked in a first direction perpendicular to the top surface of the substrate;
a first peripheral circuit layer between the substrate and the memory cell structure, the first peripheral circuit layer including first transistors that constitute row and column decoders and first interconnection patterns extending vertically, the first transistors are connected to corresponding ones of the first interconnection patterns; and
a second peripheral circuit layer between the first peripheral circuit layer and the memory cell structure, the second peripheral circuit layer including second transistors that constitute row and column decoders and second interconnection patterns extending vertically with a first group of the second interconnection patterns connecting to corresponding ones of the first interconnection patterns and a second group of the second interconnection patterns connected to corresponding ones of the second transistors, and the second transistors including core transistors that are connected to corresponding ones of the conductive lines.

2. The variable resistance memory device as claimed in claim 1, wherein:
the first peripheral circuit layer includes:
the first transistors on the substrate, and
a first lower interlayer insulating layer on the substrate and covering the first transistors, and
the second peripheral circuit layer includes:
a first semiconductor layer on the first lower interlayer insulating layer, and
the second transistors on the first semiconductor layer.

3. The variable resistance memory device as claimed in claim 2, wherein:
the second peripheral circuit layer further includes a second lower interlayer insulating layer on the first semiconductor layer and covering the second transistors, and
the memory cell structure is on the second lower interlayer insulating layer.

4. The variable resistance memory device as claimed in claim 2, wherein each of the first transistors includes:
a first gate electrode on the substrate;
a first gate insulating pattern between the substrate and the first gate electrode; and
first source/drain regions in the substrate and at both sides of the first gate electrode.

5. The variable resistance memory device as claimed in claim 2, wherein each of the second transistors includes:
a second gate electrode on the first semiconductor layer;
a second gate insulating pattern between the first semiconductor layer and the second gate electrode; and
second source/drain regions in the first semiconductor layer and at both sides of the second gate electrode.

6. The variable resistance memory device as claimed in claim 1, wherein the first transistors include peripheral transistors electrically connected to the core transistors.

7. The variable resistance memory device as claimed in claim 1, wherein the first transistors include additional core transistors connected to corresponding other ones of the conductive lines.

8. The variable resistance memory device as claimed in claim 7, wherein the first transistors further include peripheral transistors electrically connected to the core transistors and to the additional core transistors.

9. The variable resistance memory device as claimed in claim 1, further comprising a third peripheral circuit layer between the second peripheral circuit layer and the memory cell structure, the third peripheral circuit layer including third transistors having additional core transistors connected to corresponding other ones of the conductive lines.

10. The variable resistance memory device as claimed in claim 9, wherein:
the first peripheral circuit layer includes:
the first transistors on the substrate, and
a first lower interlayer insulating layer on the substrate and covering the first transistors,
the second peripheral circuit layer includes:
a first semiconductor layer on the first lower interlayer insulating layer, the second transistors on the first semiconductor layer, and
a second lower interlayer insulating layer on the first semiconductor layer and covering the second transistors, and
the third peripheral circuit layer includes:
a second semiconductor layer on the second lower interlayer insulating layer, and the third transistors on the second semiconductor layer.

11. The variable resistance memory device as claimed in claim 10, wherein:
the third peripheral circuit layer further includes a third lower interlayer insulating layer on the second semiconductor layer and covering the third transistors, and
the memory cell structure is on the third lower interlayer insulating layer.

12. The variable resistance memory device as claimed in claim 1, wherein:
each of the memory cell arrays includes memory cells spaced apart from each other in a second direction and a third direction crossing each other, the second direction and the third direction are parallel to the top surface of the substrate, and
each of the memory cells includes a variable resistance pattern and a switching pattern, which are stacked in the first direction.

13. The variable resistance memory device as claimed in claim 12, wherein the memory cell arrays includes at least four memory cell arrays.

14. A variable resistance memory device, comprising:
a substrate; and
a first peripheral circuit layer, a second peripheral circuit layer, and a memory cell structure, which are stacked on the substrate in the stated order in a first direction perpendicular to a top surface of the substrate, wherein:
the first peripheral circuit layer includes first transistors that constitute row and column decoders on the substrate and first interconnection patterns on the first transistors, and the first transistors are connected to corresponding ones of the first interconnection patterns,
the second peripheral circuit layer includes a first semiconductor layer on the first peripheral circuit layer, second transistors that constitute row and column decoders on the first semiconductor layer, and second interconnection patterns on the second transistors, a first group of the second interconnection patterns are each connected to corresponding ones of the first interconnection patterns, and a second group of the second interconnection patterns are each connected to corresponding ones of the second transistors,
the memory cell structure includes conductive layers and memory cell arrays, which are alternately stacked on the second peripheral circuit layer in the first direction, each of the conductive layers includes conductive lines, which are spaced apart from each other in a direction parallel to the top surface of the substrate, each of the memory cell arrays includes memory cells, which are spaced apart from each other in a second direction and a third direction that are parallel to the top surface of the substrate and cross each other, and
each of the memory cells includes a variable resistance pattern and a switching pattern, which are stacked in the first direction.

15. The variable resistance memory device as claimed in claim 14, wherein:
the first peripheral circuit layer further includes a first lower interlayer insulating layer, which is on the substrate to cover the first transistors and the first interconnection patterns, the first semiconductor layer is on the first lower interlayer insulating layer, the second peripheral circuit layer further includes a second lower interlayer insulating layer, which is on the first semiconductor layer to cover the second transistors and the second interconnection patterns, and the memory cell structure is on the second lower interlayer insulating layer.

16. The variable resistance memory device as claimed in claim 15, wherein:

a portion of the second lower interlayer insulating layer penetrates the first semiconductor layer and is in contact with the first lower interlayer insulating layer, and the first group of the second interconnection patterns includes second interconnection contacts penetrating the portion of the second lower interlayer insulating layer and connected to the corresponding first interconnection patterns.

17. The variable resistance memory device as claimed in claim 16, wherein:

the conductive lines of each of the conductive layers are connected to corresponding ones of the second interconnection patterns, and the conductive lines of each of the conductive layers are connected to corresponding ones of the first transistors or to corresponding ones of the second transistors through the corresponding ones of the second interconnection patterns.

18. The variable resistance memory device as claimed in claim 14, wherein:

the conductive layers include a first conductive layer and a second conductive layer, which are spaced apart from each other in the first direction, the memory cell arrays include a first memory cell array between the first conductive layer and the second conductive layer, the first conductive layer includes first conductive lines, which are spaced apart from each other in the second direction and are extended in the third direction, the second conductive layer includes second conductive lines, which are extended in the second direction and are spaced apart from each other in the third direction, and the first memory cell array includes first memory cells, which are at respective intersections between the first conductive lines and the second conductive lines.

19. The variable resistance memory device as claimed in claim 14, wherein the memory cell arrays include at least four memory cell arrays.

* * * * *